(12) United States Patent
Kim

(10) Patent No.: US 7,688,648 B2
(45) Date of Patent: Mar. 30, 2010

(54) HIGH SPEED FLASH MEMORY

(76) Inventor: Juhan Kim, 5890 W. Walbrook Dr., San Jose, CA (US) 95129

( * ) Notice: Subject to any disclaimer, the term of this patent is extended or adjusted under 35 U.S.C. 154(b) by 85 days.

(21) Appl. No.: 12/202,843

(22) Filed: Sep. 2, 2008

(65) Prior Publication Data
US 2010/0054039 A1    Mar. 4, 2010

(51) Int. Cl.
*G11C 7/00* (2006.01)
(52) U.S. Cl. .............. 365/189.14; 365/189.05; 365/189.06; 365/210
(58) Field of Classification Search ............ 365/189.14, 365/189.05, 189.06, 63, 210
See application file for complete search history.

(56) References Cited

U.S. PATENT DOCUMENTS

| | | | |
|---|---|---|---|
| 5,465,235 A | 11/1995 | Miyamoto | |
| 5,973,957 A | 10/1999 | Tedrow | |
| 5,978,264 A | 11/1999 | Onakado et al. | |
| 6,480,419 B2 | 11/2002 | Lee | |
| 6,898,145 B2 * | 5/2005 | Winograd et al. | 365/230.06 |
| 7,233,526 B2 * | 6/2007 | Umezawa | 365/185.27 |
| 7,263,003 B2 * | 8/2007 | Edahiro et al. | 365/185.25 |
| 7,277,339 B2 * | 10/2007 | Edahiro | 365/203 |

OTHER PUBLICATIONS

"A 3.3V 32Mb NAND Flash Memory with Incremental Step Pulse Programming Scheme", IEEE Journal of Solid-State Circuits, vol. 30, No. 11, pp. 1149-1156, Nov. 1996.
"A Negative Vth Cell Architecture for Highly Scalable, Excellently Noise-Immune, and Highly Reliable NAND . . . ", IEEE Journal of Solid-State Circuits, vol. 34, No. 5, Nov. 1999.
"A Channel-Erasing 1.8-V-Only 32-Mb NOR Flash EEPROM with a Bitline Direct . . . ", IEEE Journal of Solid-State Circuits, vol. 30, No. 11 Nov. 2000.

* cited by examiner

*Primary Examiner*—Son Dinh

(57) ABSTRACT

For realizing high speed flash memory, bit line is multi-divided for reducing parasitic capacitance, so that local bit line is quickly discharged when reading a memory cell and multi-stage sense amps are used, wherein the multi-stage sense amps are composed of a first dynamic circuit serving as a local sense amp connecting to the local bit line through a read transistor, a second dynamic circuit serving as a segment sense amp for reading the local sense amp, and a tri-state inverter serving as an amplify circuit of a global sense amp for reading the segment sense amp. When reading data, a cell current difference is converted to a time difference for differentiating low threshold data and high threshold data by the multi-stage sense amps. And a buffered data path is connected to the global sense amp for achieving fast data transfer. Additionally, alternative circuits and memory cell structures are described.

20 Claims, 11 Drawing Sheets

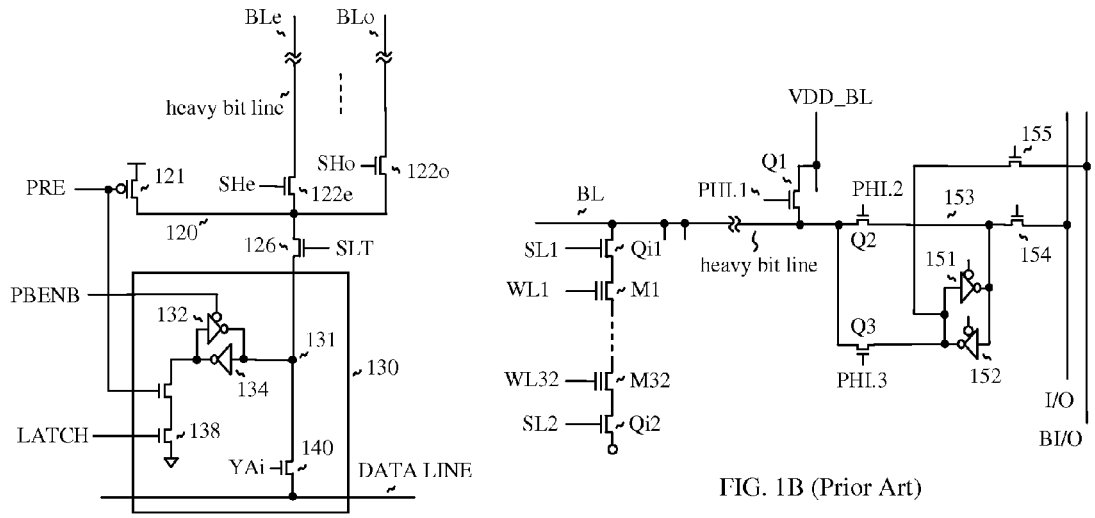
FIG. 1A (Prior Art)
FIG. 1B (Prior Art)
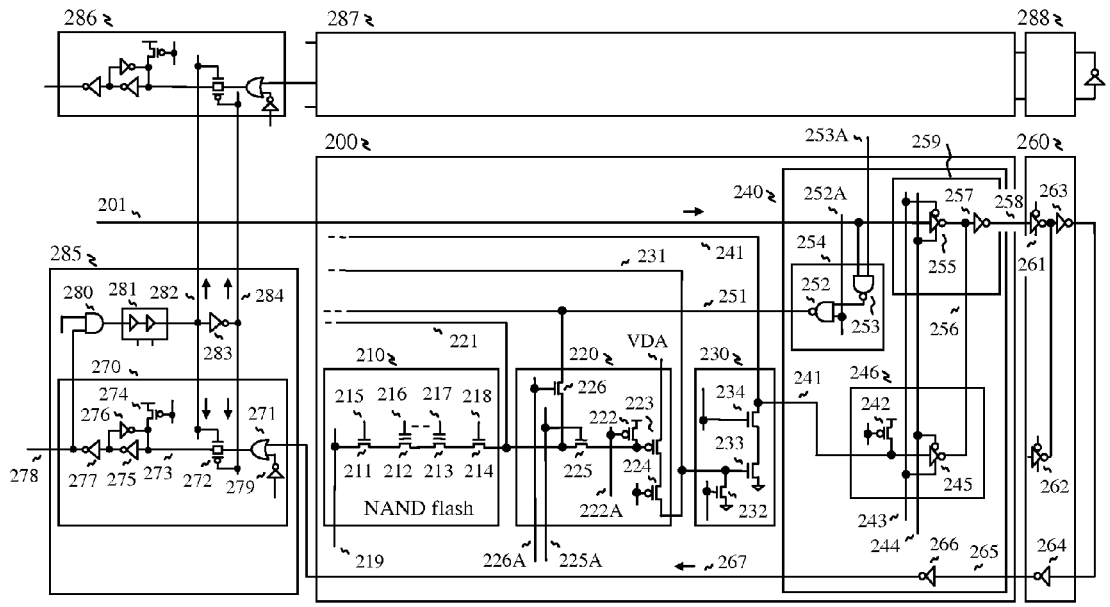
FIG. 2A

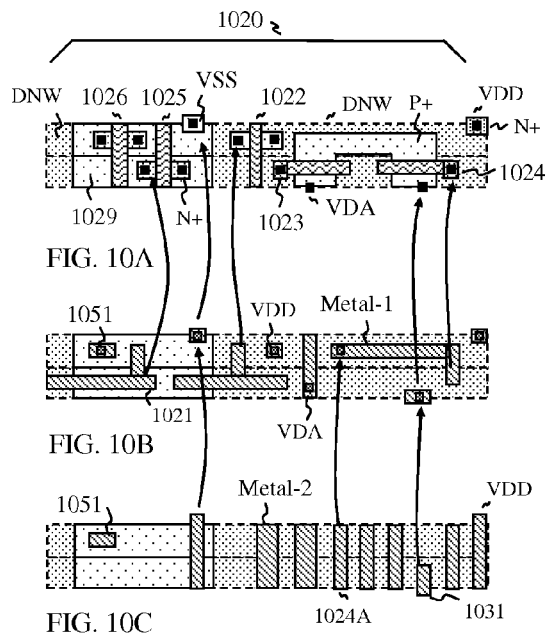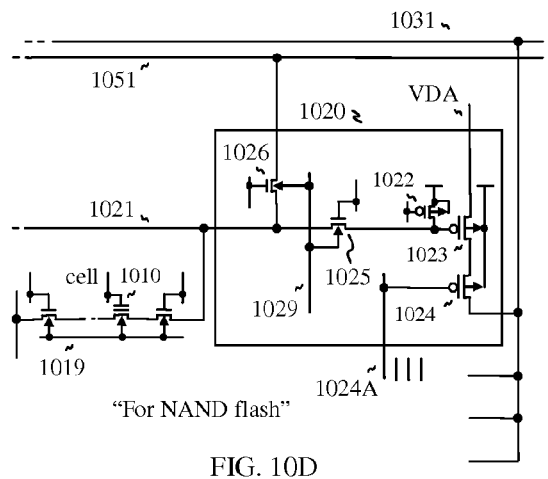
FIG. 10A
FIG. 10B
FIG. 10C
FIG. 10D
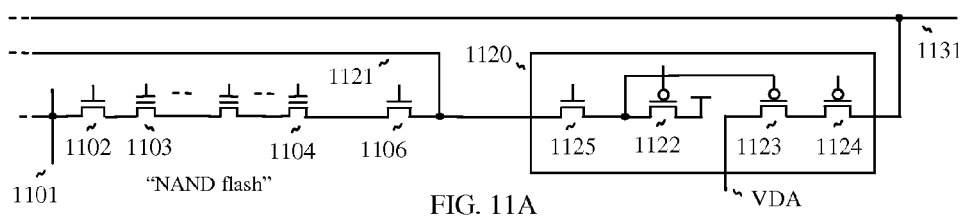
FIG. 11A
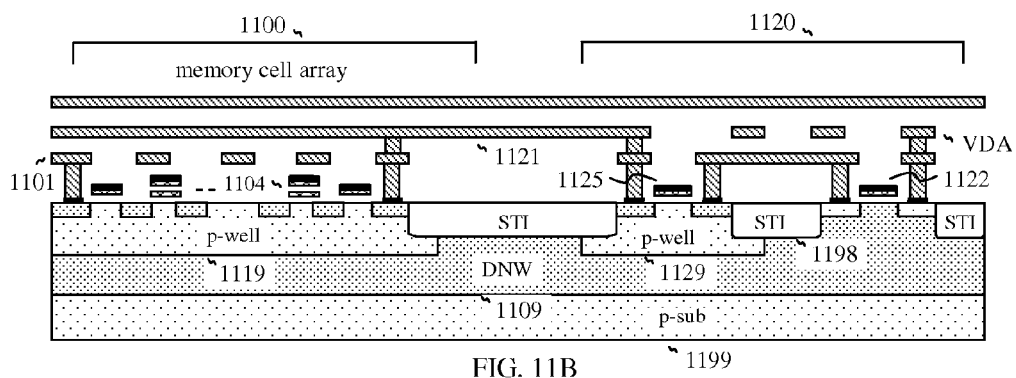
FIG. 11B NOR flash

HIGH SPEED FLASH MEMORY

FIELD OF THE INVENTION

The present invention relates generally to integrated circuits, in particular to high speed flash memory with light bit line architecture, such as, NAND flash memory and NOR flash memory.

BACKGROUND OF THE INVENTION

Flash memory device includes charges, wherein charges are stored in an isolated conductor, commonly referred to as a floating gate, in an FET (field-effect transistor) device. A memory cell (cell transistor) operates by storing electric charge (representing either a binary "0" or "1" state of one data bit) on the floating gate, which is incorporated into a MOS (Metal-Oxide Semiconductor) field-effect transistor. The stored charges affect the VT (threshold voltage) of the transistor, thereby providing a way to read the current through the storage device.

A memory cell typically consists of a transistor, a floating gate, and a control gate above the floating gate in a stacked gate structure. The floating gate, typically composed of polycrystalline silicon (i.e., "polysilicon"), is electrically isolated from the underlying semiconductor substrate by a thin dielectric layer, which is typically formed of an insulating oxide, and more particularly, silicon oxide. This dielectric layer is often referred to as a tunnel oxide layer. The control gate is positioned above the floating gate, and is electrically isolated from the floating gate by a storage dielectric layer. Thus, the floating gate serves as a charge trap region, wherein charges are stored in the charge trap region. Other charge storage devices are constructed to store charges in insulator bulk traps in the FET device, such as MNOS (metal-nitride-oxide-semiconductor), MAOS (metal-alumina-oxide-semiconductor), MAS (metal-alumina-semiconductor), and SONOS (silicon-oxide-nitride-oxide-semiconductor) memory cells.

A programmed memory cell has its VT increased by increasing the amount of negative charge stored on the floating gate, i.e., for given source and drain voltages, the control gate voltage which allows a current to flow between the source and the drain of a programmed memory cell is higher than that of a non-programmed memory cell. Therefore, the state of a memory cell is read by applying a control gate voltage below a predetermined level corresponding to the programmed state, but sufficiently high to allow a current between the source and the drain in a non-programmed memory cell. If a current is detected, then the memory cell is read to be not programmed.

The floating gate memory, such as flash memory, can configure very high density memory. Then, the flash memory is applied to cell phone, music player, movie player, the memory of the image in the digital camera, substitution of the hard disk drive, and so on.

The conventional flash memory is realized by using sense amp in order to measure the current of the floating gate transistor. In FIG. 1A, one of prior arts for the sense amp is illustrated, as published, "A 3.3V 32 Mb NAND Flash Memory with Incremental Step Pulse Programming Scheme", IEEE Journal of Solid-State Circuits, Vol. 30, No. 11, pp 1149-1156, November 1996, and U.S. Pat. No. 6,480,419 and U.S. Pat. No. 5,790,458. Before read, pre-charge transistor 121 is turned on to set a sensing node 120 to high, and another pre-charge transistor 138 resets a latch circuit 130 including a clocked inverter 132 and an inverter 134. In order to read, pre-charge signal PRE is de-activated to high, enable signal PBENB is also de-activated to high, and latch signal LATCH is low, while select signal SLT is activated to high. Then, page selection transistors 122e and 122o connect either an even bit line BLe or an odd bit line BLo to the sensing node 120 for an access. The selected memory cell (not shown) discharges latch node 131 through transfer transistor 126, when low threshold data is stored in the selected memory cell. Otherwise the memory cell does not discharge the latch node 131, thus the latch keeps high. After then, the latched data is transferred to DATA LINE by Y access transistor 140.

In FIG. 1B, another circuit shows the structure of the essential portion of a NAND flash memory device, as a prior art which is published as "A Negative Vth Cell Architecture for Highly Scalable, Excellently Noise-Immune, and Highly Reliable NAND Memories", IEEE Journal of Solid-State Circuits, Vol. 34, No. 5, pp 675-684, November 1999, and U.S. Pat. No. 6,049,494. Namely a sensing circuit that is concerned with data writing and reading. For the sake of diagrammatic simplification, FIG. 1B shows each unit consisting of a plurality of NAND memory cells whose drains are commonly connected to a bit line. More specifically, each unit comprises a flip-flop circuit 151 and 152 for temporarily holding a data, a bit line BL, NAND memory cells M1 and M32, N-channel transistor Q1 for pre-charging the bit line BL to a predetermined potential, N channel transistor Q2 for connecting the bit line BL to the flip-flop circuit, and N-channel transistor Q3 having both ends connected between a node of the flip-flop circuit on the opposite side to the bit line BL and a bit line side end of the transistor Q2. This transistor Q3 is provided to hold read data and then output a potential corresponding to inverted data of the read data to the bit line BL. The individual terminals of the flip-flop circuit are connected to an I/O line and a BI/O line via a column gate 154 and 155, respectively. The control signals phi.1, phi.2 and phi.3 are generated by sequential control circuit (not shown) for driving operation modes. A phi.1 signal line is connected to the gate of the transistor Q1 to control the pre-charging. A phi.2 signal line and a phi.3 signal line are respectively connected to the gate of the transistor Q2 and the gate of the transistor Q3, and are controlled at predetermined timings. The source of the transistor Q1 is connected to a power supply which provides a high supply voltage (for example, 9V) in write mode and a low supply voltage (for example, 5V) otherwise. The power supply for the flip-flop circuit 151 and 152 is provided as the same manner.

A description will now be given of the operation of copying data of a memory cell (for example, M1). It is assumed that the copying destination cell (for example, M1) has been erased previously, i.e., it has been set ON previously. First, data of the cell (for example, M1) is read out. At this time, the individual transistors of the flip-flop circuit (151 and 152) which receive clocks (not shown) are cut off and are disabled. The transistor Q2 connected to the bit line BL is set off and the transistor Q3 is also set off. Suppose that the bit line BL is pre-charged to a high level and the transistor Q2 is turned on to set the bit line BL in a free running state. After a proper time elapses, the flip-flop circuit (151 and 152) is enabled. When the potential of the bit line BL then is higher than the threshold value voltage of the flip-flop circuit, i.e., when data is written in the cell M1 and the threshold value is high, a node 153 between the bit line BL and the flip-flop circuit is set to a high level. If the cell M1 is left erased, the bit line BL is discharged so that the node 153 is set to a low level. This completes the reading operation. That is, the read data in the cell M1 is latched in the flip-flop circuit.

The conventional flash memory has progressed its miniaturization and as a result there arises difficulties in obtaining necessary current to measure the stored data in the memory cell. The turn-on current of the memory cell should drive the selected bit line because the bit line is relatively heavy and long to connect multiple memory cells. And as shown in the prior arts, the latch circuit including two clocked inverters and switches is controlled by timing generator circuit (not shown) wherein the timing is generated by delay circuits typically. This means that the memory cell should discharge the heavy bit line within the predetermined time. And the ratio between the turn-on current and the turn-off current should be relatively high to differentiate low threshold data and high threshold data, such as several 1000 times different. When the ratio is very low, the leakage current (turn-off current) may also discharge the bit line, which may cause the sensing error because the latch node is discharged whether the threshold voltage of the memory cell is low or high. And also the timing generation for controlling the latch is more difficult because there is no precise timing generator based on the turn-on current.

Furthermore, one of major problem is that the turn-on current through the floating gate MOS transistor is low, around 1 uA or less for the conventional flash memory, as published, "A 90-nm CMOS 1.8-V 2-Gb NAND Flash Memory for Mass Storage Applications", IEEE Journal of Solid-State Circuits. Vol. 38, No. 11, November 2003. Even worse in the other types of floating gate memory, such as the nanocrystal memory, the drain current of the memory cell is around 1 nA or less, as published, "Metal Nanocrystal Memories—Part II: Electrical Characteristics", IEEE Transactions on Electron Devices, Vol. 49, No. 9, September 2002. And for the single electron memory (SEM) including quantum dot, the drain current is 1.5 p~3 pA as published, "Room temperature Coulomb oscillation and memory effect for single electron memory made by pulse-mode AFM nano-oxidation process", 0-7803-4774-9/98 16.6.2 IEDM 1998.

In this respect, there is still a need to improve the floating gate memory, in order to read the memory cell more effectively, even though the memory cell can flow relatively low current. In the present invention, multi-divided bit line architecture is introduced to reduce the parasitic capacitance of the bit line, and multi-stage sense amps are used for reading the memory cell through the multi-divided local bit line. In particular, a buffered data path is used for writing and reading data, which realizes fast random access.

And, the memory cell can be formed from single crystal silicon on the surface of a wafer. Alternatively, the memory cell can be formed from thin film polysilicon layer, because the lightly loaded bit line can be quickly discharged by the memory cell even though the thin film memory cell can flow relatively low current. In doing so, multi-stacked NAND flash memory is realized with the thin film memory cell, which can increase the density of the flash memory within the conventional CMOS process with additional process steps.

SUMMARY OF THE INVENTION

For realizing high speed read operation for the flash memory, such as NAND flash memory and NOR flash memory, bit line is multi-divided, which reduces parasitic capacitance, so that the divided bit line is quickly charged when reading and multi-stage sense amps are used for connecting divided bit line, wherein the multi-stage sense amps are composed of dynamic circuits for realizing fast access and eliminating penetration current when reading. More specifically, the multi-stage sense amps include a first dynamic circuit serving as a local sense amp, a second dynamic circuit serving as a segment sense amp, and a first tri-state inverter serving as an amplify circuit of a global sense amp, while a second tri-state inverter is used for bypassing an output from a previous memory block, which configures a data transfer circuit. The dynamic circuits are also useful to reduce operating voltage for realizing low power consumption, because the dynamic circuits are turned on around threshold voltage of MOS transistor for detecting whether the amplify circuit is turned on or not by a selected memory cell. With multi-stage sense amp, fast read operation is realized because each sense amp drives a lightly loaded and divided bit line, such that the memory cell drives the light loaded local bit line, the local sense amp drives a segment bit line for transferring a read output to the segment sense amp, the segment sense amp drives a global bit line for transferring the read output to the global sense amp, and the global sense amp drives a very lightly loaded common node of the data transfer circuit for transferring the read output to an output latch circuit.

And a buffered data path is connected to the global sense amp for writing and reading a data, wherein a forwarding write line serving as a forwarding write path is used for writing, such that the forwarding write path is selected by block select signals, which realizes to reduce driving current and RC time constant, because unselected portion of the data line is not charging or discharging when writing. Furthermore, unselected portion of the data line is used as a returning read path. Thus, the returning read path receives a read output from the memory cell through multi-stage sense amps. And the returning read path is also buffered and connected to data output node through multiple buffers. With the returning read path, access time is almost same regardless of selected memory cell location, which realizes to latch the read output at a time with enough set-up and hold time even though a latch clock is fixed.

And, amplifying transistors of the sense amps are composed of relatively long channel transistors than those of pre-charge transistors in order to reduce turn-off current, which reduces power consumption.

In order to match the width of the local sense amp with pitch of two memory cells, the local sense amps are fit with pitch of two memory cells, so that the local sense amp is connected to multiple NAND strings through a local bit line, where the NAND string includes a memory cell array having a series connection with a plurality of memory cells. And the segment sense amps are also fit with pitch of two memory cells. And the global sense amp is shared by eight columns. For configuring high density and high speed memory, small local sense amp is frequently repeated, but the segment sense amp is rarely repeated. And the global sense amp is used only for a memory block or bank. Thereby the sense amp area is relatively negligible portion as long as the memory cells occupy most of the array region.

Furthermore, configuring the memory is more flexible, such that number of sense amps can be determined by the target speed. For example, high speed application needs more segmented array with more sense amps, while high density application needs more memory cells with reduced number of sense amps, thus cell efficiency is increased.

Furthermore, the local sense amp has high gain with wider channel MOS transistor than that of the memory cell, and the segment sense amp has higher gain than that of the local sense amp. For instance, a wider channel MOS transistor can be used as the segment amplify transistor for the segment sense amp, which realizes fast read operation.

By the sense amps, a current difference in the memory cell is converted to a time difference as an output of the global sense amp with gain of the sense amps. In this manner, a time-domain sensing scheme is realized to differentiate low threshold data and high threshold data in the memory cell. For instance, a selected memory cell storing a low threshold data is turned on at a given word line voltage, and which is quickly transferred to an output latch circuit through the sense amps with high gain, but a selected memory cell storing a high threshold data is turned off, and which is rejected to be latched by a locking signal based on low threshold data as a reference signal.

More specifically, a reference signal is generated by one of fast changing data, such as low threshold data, with high gain from reference cells, which signal serves as a reference signal to generate a locking signal for an output latch circuit in order to reject latching another data, such as, high threshold data, which is slowly changed with low gain, so that low threshold data (in a charge trap region) is arrived first while high threshold data is arrived later. The time-domain sensing scheme effectively differentiates low threshold data and high threshold data with time delay control, while the conventional sensing scheme is current-domain or voltage-domain sensing scheme. In the convention memory, the selected memory cell charges or discharges a long and heavy bit line, and the changed voltage of the bit line is compared by a latch which determines an output at a time. In the present invention, there are many advantages to realize the time-domain sensing scheme, so that the sensing time is easily controlled by a tunable delay circuit, which compensates cell-to-cell variation and wafer-to-wafer variation, such that there is a need for adding a delay time before locking the output latch circuit with a statistical data for all the memory cells, such as mean time between fast data and slow data. Thereby the tunable delay circuit generates a delay for optimum range of locking time. And a read output from the memory cell is transferred to the output latch circuit through a returning read path, thus the access time is equal regardless of the location of the selected memory cell, which is advantageous to transfer the read output to the external pad at a time.

Furthermore, the time-domain sensing scheme is useful for reducing the cell current difference between the turn-on current of the low threshold data and the turn-off current of the high threshold data. In the conventional flash memory, there is at least several 1000 times difference between the turn-on current and the turn-off current, in order to read the memory cell with existing comparator or an inverter latch through heavy bit line. In the present invention, the current difference can be reduced, for example, to several 100 times instead of several 1000 times, as long as the distribution of the difference is stable at a given fabrication process for manufacturing because lightly loaded bit line can be driven by the weak memory cell through multi-stage sense amps in the time domain, which means that the memory cell can be miniaturized further.

Furthermore, various alternative configurations are described for implementing the multi-stage sense amps. And, example memory cell layout and cross sectional views are illustrated to minimize cell area. The fabrication method is compatible with the conventional CMOS process for realizing planar memory cell including the single-crystal-based transistor. Alternatively, LTPS (low temperature polysilicon) layer is used for forming thin film transistor as a memory cell, which realizes multi-stacked memory cells, so that the thin film memory cell can drive lightly loaded bit line (local bit line) even though thin film polysilicon transistor can flow lower current. And a body of the thin film transistor is connected to a bias voltage for alleviating self-heating problem in short channel thin film transistor. Furthermore, the memory cell can be formed from various semiconductor materials, such as silicon-germanium and germanium.

Furthermore, any type of floating gate device can be used as a storage device, such as MNOS (Metal-Nitride-Oxide Semiconductor), SONOS (Silicon-Oxide-Nitride-Oxide Semiconductor), MAOS (metal-alumina-oxide-semiconductor), MAS (metal-alumina-semiconductor), nanocrystal memory including nanocrystal layer, single electron memory including quantum dot, and so on.

Still furthermore, the sensing scheme is alternatively useful to read a NOR flash memory in the similar manner, wherein the NOR flash memory cell is read by the multi-stage sense amps.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

FIG. 1A illustrates a sensing circuit for NAND flash memory as a prior art. And FIG. 1B illustrates another sensing circuit for NAND flash memory as a prior art.

FIG. 2A illustrates NAND flash memory with light bit line architecture.

FIGS. 10A, 10B and 10C illustrate an example layout for the local sense amp and the sense amp, and FIG. 10D illustrates a related schematic for the example layout, according to the teachings of the present invention.

FIG. 11A illustrates a related circuit schematic for explaining a cross sectional view of a planar memory cell, and FIG. 11B illustrates a cross sectional view for the memory cell array, according to the teachings of the present invention.

DETAILED DESCRIPTION OF PREFERRED EMBODIMENT(S)

Figure 2B:
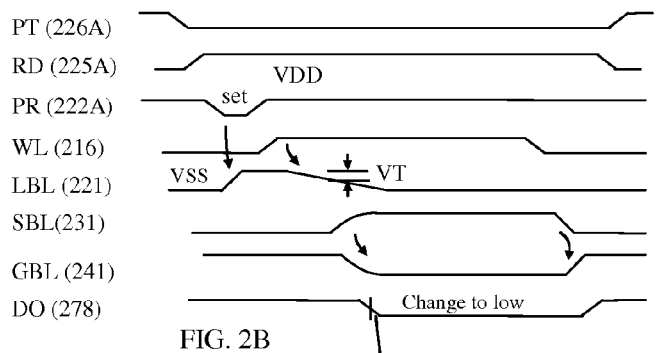
FIG. 2B illustrates a timing diagram for reading low threshold data.

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

The present invention is directed to NAND flash memory with light bit line architecture, as shown in FIG. 2A, wherein a memory block 200 comprises a NAND string 210, a local sense amp 220, a segment sense amp 230, and a global sense amp 240. The local sense amp 220 is connected to the NAND string 210 through a local bit line 221, wherein the NAND string includes a plurality of memory cells with a series connection even though the drawing illustrates two memory cells 212 and 213 for simplifying the schematic, a program (write) transistor 226 for programming, and a read transistor 225 for reading. The program transistor 226 is controlled by a program control signal 226A. The read transistor 225 is controlled by a read control signal 225A. The memory cell 212 is controlled by a word line 216, and the other memory cell 213 is controlled by the other word line 217. The memory string is serially connected to an upper select transistor 214 which is controlled by an upper select signal 218, and a lower select transistor 211 which is controlled by a lower select signal 215, where the upper select transistor 214 is connected to the local bit line 221 and the lower select transistor 211 is connected to a source line 219. And the program transistor 226 serves as a write switch between the local bit line 221 and a write bit line 251, a read transistor 225 serves as a read switch between the local bit line 221 and an amplify node which is connected to a gate of a local amplify transistor 223, a pre-charge transistor 222 is connected to the amplify node for pre-charging, and a local select transistor 224 is serially connected to the local amplify transistor 223 for enabling and selecting the local amplify transistor. And the local amplify transistor 223 is powered by an amplifying voltage VDA which is lower than VDD−VT voltage, so that the local amplify transistor 223 detects whether the local bit line is discharged to lower than VDD−2VT voltage, because a source of the PMOS local amplify transistor 223 is connected to VDD−VT voltage. Hence, more accurate detection is executed by supplying VDA voltage to the local amplify transistor 223. Alternatively, VDD voltage can be still supplied to the local amplify transistor 223 for the detection, which equally works for read operation.

The segment sense amp 230 includes a reset transistor 232 for resetting a segment bit line 231 which is connected to the local select transistor 224, a segment amplify transistor 233 for receiving an output from one of multiple local sense amps through the segment bit line 231, and a segment select transistor 234 connecting to the segment amplify transistor for selecting the segment amplify transistor.

The global sense amp 240 includes a write circuit 254 including a data receive circuit 253 for receiving write data from a forwarding write line 201 and a write bit line drive circuit 252 for driving the write bit line 251, a global amplify circuit 246 including a first tri-state inverter 245 as an amplify circuit for reading the global bit line 241 and a pre-set transistor 242 for pre-setting the global bit line 241 to high, and a data transfer circuit 259 including a second tri-state inverter 255 for bypassing an input from the forwarding write line 201 and a read inverter 257 for transferring a read output from the global amplify circuit 246 and an output from the second tri-state inverter 255 through a common node 256, and a returning buffer circuit 266 for buffering a returning read line 265.

In order to improve performance, the local bit line 221 is shorter than that of conventional array architecture for reducing capacitive loading. For instance, the local bit line loading is $\frac{1}{128}$ or $\frac{1}{256}$, compared with the conventional bit line. However, by dividing the bit line into short lines, more sense amps are required. Thus, each sense amp should occupy a small area for inserting between the divided memory arrays. Furthermore, three-stage sense amps are useful for reading the memory cell, such that the local sense amp 220 includes five transistors, the segment sense amp 230 included three transistors, and the global sense amp 240 occupies around three transistors per eight columns because it is shared by eight columns where the global sense amp is composed of twenty-one transistors.

For reading and writing data, a buffered data path is used, such that the buffered data path includes forwarding write path and returning read path, which realize to reduce RC (resistor-capacitor) loading for each data line, because data line is divided into short line while unselected portion of the data line is not discharging when writing. Furthermore, unselected portion of the data line is used as a read data line which is a forwarding read line 258. Thus, the forwarding read line 258 receives a read output from a memory cell through multi-stage sense amps. And the forwarding read line 258 is buffered and connected to data output node 267 through multiple buffers and the returning read line 265. With the returning read path, access time is almost same regardless of selected memory cell location, which realizes to latch the read output at a time with enough set-up and hold time even though a latch clock is fixed. When writing, the forwarding write line 201 serves as a write path, such that a write circuit 250 is enabled by a write enable signal 253A for receiving a data input from the forwarding write line 201. More detailed read operation and write operation will be explained as below.

In order to reduce chip area, the local sense amp receives an output from at least one NAND string through the local bit line 221, the segment sense amp receives an output from one of multiple local sense amps through the segment bit line 231, and the global sense amp 240 receives an output from one of multiple segment sense amps through the global bit line 241. In doing so, the local sense amp 220 serves as a first sense amplifier which drives the segment bit line 231 as a capacitive load. And the segment sense amp 230 serves as a second sense amplifier which drives the global bit line 241 as a capacitive load, so that the global amplify circuit 246 in the global sense amp 240 serves as a third sense amplifier. And the global sense amp 240 is connected to the buffered data path for receiving and transferring data.

When reading data "0" (low threshold data) from the memory cell 212, for example, a current flow is measured by the local sense amp 220, such that the program transistor 226 is turned off by de-asserting the program control signal 226A for releasing the local bit line 221 from VSS (ground) voltage while the write bit line 251 keeps low. And then the read transistor 225 is turned on by asserting the read control signal 225A to VDD voltage or higher than VDD+VT voltage, while the pre-charge transistor 222 is turned on, in order to raise the local bit line near VDD voltage, where VDD voltage is supply voltage and VT voltage is threshold voltage of the transistor. After raising the local bit line 221, the pre-charge transistor 222 is turn off. After then, the memory cell 212 is turned on, for measuring the memory cell, by asserting the word line 216 (said control gate) to a pre-determined read voltage, and also unselected memory cell 213 is bypassed with VPASS voltage (higher than the pre-determined read voltage) by asserting the unselected word line 217. And also the upper select transistor 214 is turn on by asserting an upper select signal 218, and the lower select transistor 211 is also turned on by asserting a lower select signal 215, while the source line 219 keeps low. Alternatively, the lower select transistor 211 is turned on finally, for measuring the selected memory cell more effectively.

By asserting the word line, the local bit line 221 is discharged by the selected memory cell 212 through the NAND string, the unselected cell transistor 213, and the upper and lower select transistors 211 and 214. Discharging the local bit line 221, a local amplify transistor 223 sets up a strong current path to the segment bit line 231 when a local select transistor 224 is turned on. Hence, the segment bit line 231 is quickly charged near VDD voltage from VSS voltage (reset voltage) while the reset transistor 232 is turned off. And then, a segment amplify transistor 233 of the segment sense amp 230 quickly discharges the global bit line 241 when the segment select transistor 234 is turned on. As a result, the common node 256 is quickly changed to high by the first tri-state inverter 245 while the pre-set transistor 242 is turned off.

Thus, a read inverter 257 receives the common node voltage 256, while the second tri-state inverter 255 is turned off. In doing so, the read output is transferred to an output latch circuit 270 through the forwarding read line 258 and inverting buffers in unselected memory block 260, while unselected second tri-state inverter 261 is turned on for bypassing the read output but unselected first tri-state inverter 262 keeps turn-off state. As a result, the read output is reached to the output node 278 through inverting buffers 261, 263, 264 and 266, and the output latch circuit 270, wherein the inverting buffer 266 is repeated in the global sense amp for buffering, which configure a returning read path. And during standby, the write data 201 keeps high state for resetting the common node 256 to low state by turning on the second tri-state inverter 255.

In contrast, when reading data "1" (high threshold data), the local bit line 221 is not discharged because the selected memory cell 212 is not turned on, thus the local bit line 221 is not changed at a short time or very slowly discharged by turn-off current of the memory cell. Thereby the local amplify transistor 223 does not set up a strong current path but sets up very weak current path with leakage current to the segment bit line 231. Hence, the segment bit line is very slowly charged.

And the global bit line 241 is also slowly discharged by the segment sense amp. As a result, the common node 256 of the global sense amp is not raised to high during a predetermined time, such that the common node 256 keeps the pre-charged state at VSS voltage.

In doing so, data "1" is not arrived to the output latch circuit, such that the current difference of the selected memory cell is converted to time difference with gain difference of the sense amps. Thus data "0" serves as a reference signal to reject latching data "1" to the output latch circuit for differentiating the fast data (low threshold data) and the slow data (high threshold data) in a time domain.

Particularly, in order to reduce turn-off current, the local amplify transistor 223 is composed of longer channel length transistor than that of the reset transistor 232 of the segment sense amp, the segment amplify transistor 233 is composed of longer channel length transistor than that of the pre-set transistor 242 of the global sense amp. Alternatively, the pre-charge transistors 222, the reset transistor 232 and the pre-set transistor 242 are composed of low threshold MOS transistor, such that the low threshold transistors keep the pre-charge state strongly with sub-threshold leakage current when reading data "1", because the segment bit line 231 and the global bit line 241 keep pre-charge state while the local amplify transistor 223 is turned off. In addition, the local amplify transistor and the segment amplify transistor are composed of high threshold MOS transistor, for realizing low power operation as another alternative configuration, while the local amplify transistor and the segment amplify transistor are composed of equal channel length transistor to that of the reset transistor of the segment sense amp and the pre-set transistor of the global sense amp.

The local amplify transistor 223 is stronger than the memory cell, and the segment amplify transistor 233 is much stronger than the local amplify transistor 223 with wide channel. Furthermore, the sense amp need not reference bit line because the sense amp does not compare voltage or current with reference bit line, but the sense amp detects whether the local amplify transistor 223 is turned on or not by the selected memory cell through the local bit line.

In the output latch circuit 270, the read output changes the latch node 273 and output 278 to low from high through inverters 275 and 277 because the latch node 273 is pre-charged to high by PMOS 274 and an OR gate 271 with inverter 279 before activated. After then, the read output is stored in the latch node 273 with cross coupled inverters 275 and 276. And the output 278 changes AND gate 280 to low, so that a transmission gate 272 is locked by signal 282 and 284 which are transferred from the output 278 through a tunable delay circuit 281 (FIG. 6A) and inverter 283. Simultaneously, output latch circuits 280 and 281 are also locked by the signal 282 and 284, where main output latch circuit 286 is composed of same circuit as the output latch circuit 270. In doing so, the output 278 serves as a reference signal, which is generated by the reference memory cells, such as the memory cells 212 and 213 which store data "0" (low threshold data). Adding delay circuit 281, the reference signal serves as a locking signal, where the delay circuit is tunable for differentiating data "0" and data "1", more effectively. As a result, the sensing scheme including the locking signal is referred to as a "time-domain sensing scheme" with multi-stage sense amps.

Thus, the output latch circuit 270 and the delay circuit 281 configure a latch control circuit 285, in order to generate the locking signal. More detailed delay circuit will be explained as below. And the AND gate 280 is used to generate the reference signal even though one of reference cells is failed, where more than one reference column is added to the memory block even though the drawing illustrates only one reference memory column including the output latch circuit 270. In this manner, the read outputs from the main memory block 287 and 288 are stored to the output latch circuit 286 by the locking signals 282 and 284 when activated.

And program operation is executed through the program transistor 226. A data 201 is transferred to the selected memory cell of the selected NAND string 210 through the write bit line 251 which is driven by the write circuit 250 including a receiving circuit 253 and a write bit line drive circuit 252. Before program, erase operation is executed. More detailed explanation will be followed as below.

Referring now to FIG. 2B in view of FIG. 2A, a timing diagram for reading low threshold data is illustrated. To read data, the program transistor 226 is turned off for releasing the local bit line (LBL) 221 by de-asserting the program control signal (PG) 226A to ground voltage. And then, the read transistor 225 is turned on by asserting the read control signal (RD) 225A to higher than VDD+VT for avoiding threshold voltage drop. Then the pre-charge (PR) signal 222A is lowered from high to low for pre-charging the local bit line 221 to VDD voltage. After pre-charging, the pre-charge signal 222A is returned from low to high for releasing the local bit line 221. After then, the word line 216 serving as a control gate is raised to predetermined voltage, in order to measure the selected memory cell 212, and the unselected memory cell 213 is bypassed by raising the gate 217 to VPASS voltage which is enough high to turn on the high threshold memory cell. And, the select transistors 215 and 218 are turned on, which sets up a current path from the local bit line 221A to the source line 219 connecting to ground voltage. By the current path, the local bit line 221 is discharged to ground voltage.

When the local bit line 221A is discharged by the selected memory cell storing low threshold data (data "0"), The local amplify transistor 223 is turned on, which charges the segment bit line 231 while the local select transistor 224 is turned on. Charging the segment bit line (SBL) 231, the segment amplify transistor 233 is turned on when the segment select transistor 234 is turned on to enable the segment amplify transistor 233. Thus the global bit line (GBL) 241 is discharged to ground voltage from pre-charged voltage VDD, while the pre-set transistor 242 is turned off.

Discharging the global bit line 241, the common node 256 is changed to high from low, and which output is transferred to output node (DO) 278 through the returning read path including tri-state inverters and inverting buffers. During read operation, no phase control signal is used, such that the cell data is immediately transferred to the output node 278 through the read path. Hence, read control is relatively simple, which also realizes fast access with lightly loaded bit line. After reading the data, the pre-charge (PR) signal 222A, the word line, and other control signals are returned to pre-charge state or standby mode.

Figure 2C:
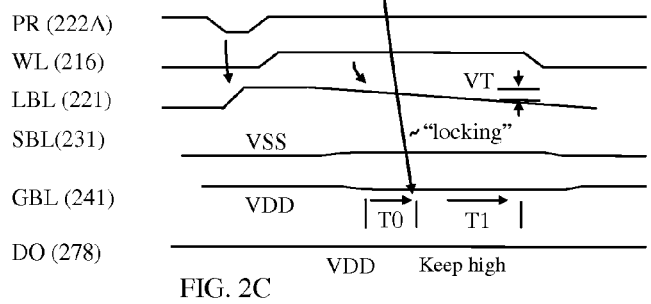
FIG. 2C illustrates a timing diagram for reading high threshold data, according to the teachings of the present invention.

Referring now to FIG. 2C in view of FIG. 2A, detailed read timing diagram for high threshold data (data "1") is illustrated, wherein the local amplify transistor 223 in the local sense amp 220 does not pull down the gate (amplify node) of the segment amplify transistor 233 through the local bit line 221, which does not pull up the segment bit line 231. And the segment sense amp 230 does not pull down the global bit line 241 either, because the local bit line (LBL) 221 is not discharged by the memory cell when the high threshold data is stored in the charge trap region. Thereby, the output (DO) 278 keeps high. However, the local bit line 221 is slowly discharged by leakage current and the segment bit line (SBL) 231 is also slowly charged by the turn-off current. When the local bit line 221 is reached to VDD−VT voltage, the PMOS transistor 223 starts to turn on and pulls up the gate of segment amplify transistor 233, which gradually pulls down the global bit line 241 through the segment sense amp. Hence, the global bit line 241 may change the common node 256. In order to avoid the false flip with the leakage current, the reference signal is generated by low threshold data with delay time as shown T0, so that the timing margin T1 is defined to reject the high threshold data to be latched in the output latch circuit 286.

Figure 3A:
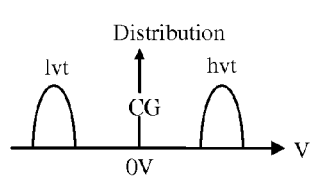
FIG. 3A illustrates a distribution graph for binary level memory cells.
Figure 3B:
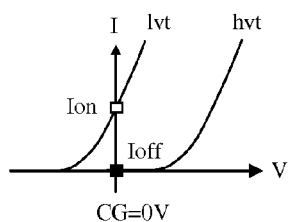
FIG. 3B illustrates I-V curve of the binary level memory cell.
Figure 3C:
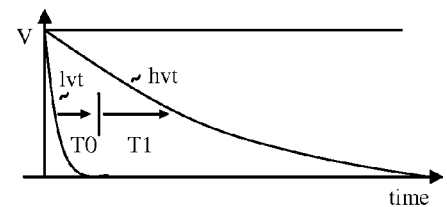
FIG. 3C illustrates discharge times of local bit line for low threshold data and high threshold data.
Figure 3D:
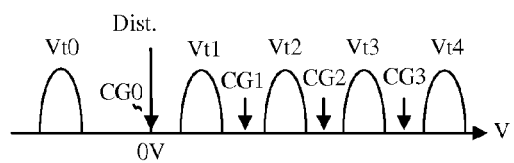
FIG. 3D illustrates a distribution graph of the multi-level memory cells, according to the teachings of the present invention.

In FIG. 3A, a distribution graph for binary level memory cell is illustrated, wherein the distribution of the low threshold data of the memory cell "lvt" is lower than that of the high threshold data of the memory cell "hvt". Hence, the current flow of the "lvt" memory cell "Ion" is higher than that of the "hvt" memory cell "Ioff" at a given control gate (word line) voltage (CG=0V), as shown in FIG. 3B. And in FIG. 3C, discharge times of the local bit line for low threshold data and high threshold data are illustrated, such that discharge time of high threshold data is defined as T0+T1. Thereby, the best locking time is regarded as T0, only if T0 is an optimum time between low threshold data and high threshold data in the discharge time. However, it is not necessary that T0 is middle when the "Ioff" current is very low. Thus, the delay time T0 should be optimized after collecting statistical data of the distribution of the memory cells. In FIG. 3D, a distribution graph of the multi-level memory cell is illustrated, wherein the threshold voltage Vt0, Vt1, Vt2, Vt3, and Vt4 are defined for storing four-level data, and the control gate voltage CG0, CG1, CG2, and CG3 are forced in order to measure each level of data, respectively.

Figure 4A:
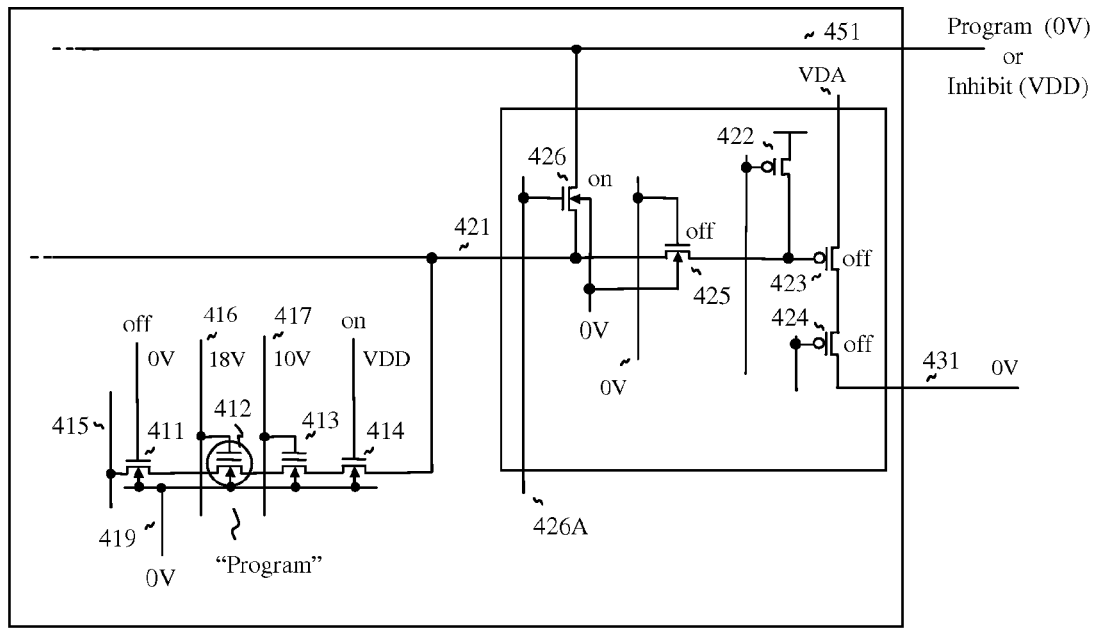
FIG. 4A illustrates a related circuit schematic for programming.

In FIG. 4A, a simplified circuit schematic for programming is illustrated, In order to program the memory cell (to store high threshold data), the program transistor 426 is turned on for lowering the local bit line to low, by asserting the program control signal 426A to VDD or VDH (higher than VDD+VT voltage), while the read transistor 225 is turned off and amplifying transistors including the pre-charge transistor 422, the local amplify transistor 423 (which is connected to VDA voltage) and the local select transistor 424 of the local sense amp are also turned off. The segment bit line 431 keeps low. And a selected word line 416 is asserted to a predetermined program voltage (for example, VPGM voltage=18V) for activating the memory cell 412 while another word line 417 of the unselected memory cell 413 is forced to VPASS voltage, for example, 10V. And more memory cells can be serially connected even though a few memory cells are shown in the drawing for ease of understanding. During program, high voltage is forced to the selected memory cell 412 from the selected word line 416 (18V) to body 419 (0V) while the unselected memory cell 413 is not programmed with reduced gate voltage (10V). In contrast, for inhibiting program (to keep low threshold data from erased state), the local bit line 421 is sustained near VDD by keeping the write bit line 451 to VDD voltage while the program transistor 426 is turned on.

Figure 4B:
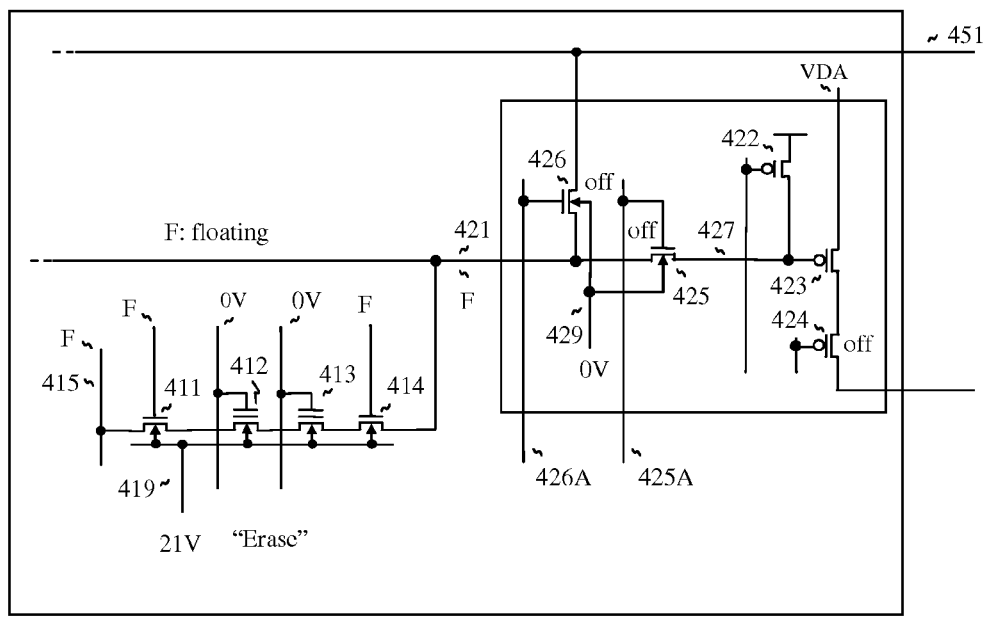
FIG. 4B illustrates a related circuit schematic for erasing, according to the teachings of the present invention.

In FIG. 4B, a simplified circuit schematic for erasing is illustrated, wherein a p-well 419 for NAND string is forced to erase voltage (for example, 21V). The source line 415 is floating. And the local bit line 421 is floating as well, while turning off the program transistor 426 and the read transistor 425. More specifically, the program transistor 426 and the read transistor 425 are formed on a separate p-well 429, which is forced to ground voltage, for establishing a reverse bias from the local bit line (n-type drain) to the separate p-well 429 (0V). And the pre-charge transistor 422, the local amplify transistor 423 (connected to VDA voltage) and the local select transistor 424 in the local sense amp are turned off. During erase, the control gates of the memory cells 416 and 417 are forced to low (0V), and the selector signals 411 and 414 are floating. Alternatively, for reducing gate stress, the write bit line 451 keeps high while the program transistor 426 is still turned off.

Figure 5:
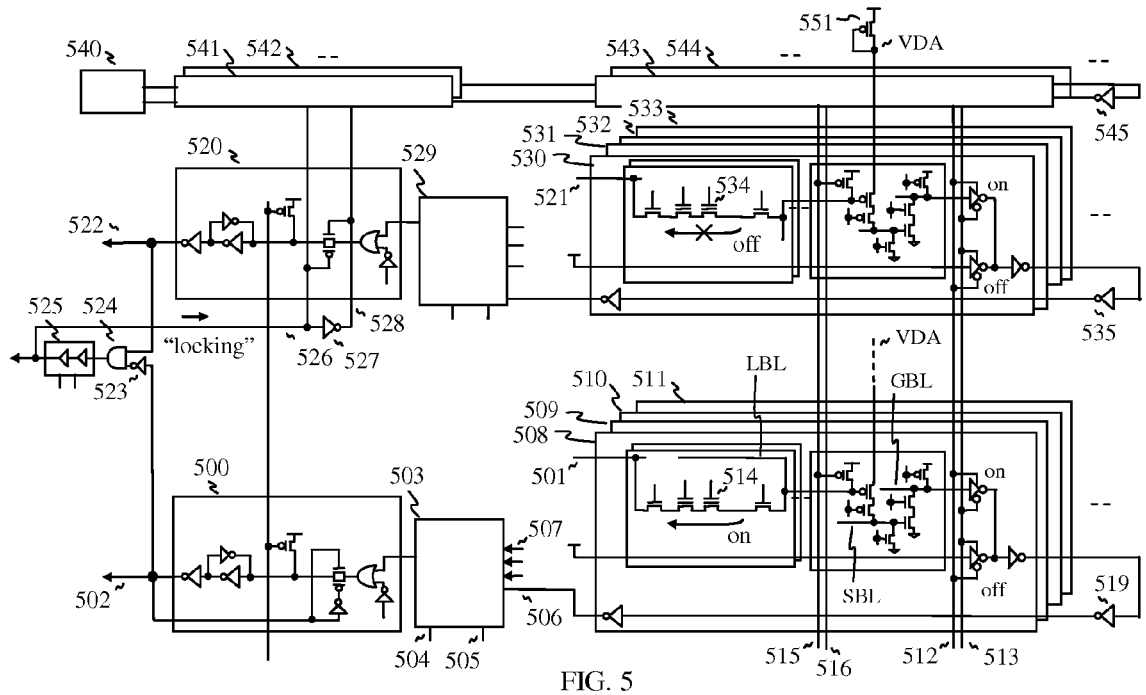
FIG. 5 illustrates a related circuit schematic for reading multi-level memory cell, according to the teachings of the present invention.

In FIG. 5, a circuit schematic for reading multi-level memory cell is illustrated. In order to read multi-level data from the memory cell, multiple reference signals are used to measure each level, wherein the memory cell 514 in the memory block 508 stores the first threshold data (Vt0 in FIG. 3D), the memory cells in the memory block 509 stores the second threshold data (Vt1), the memory cells in the memory block 510 stores the third threshold data (Vt2), the memory cells in the memory block 511 stores the fourth threshold data (Vt3), in order to measure four level threshold data. More levels can be measured only if more reference signals are generated by each reference cell storing the related threshold data, even though the drawing depicts only four memory blocks for measuring four levels. When the first level is measured, the first reference signal is selected by the block selector signals 512 (low) and 513 (high), and pre-charge signal 515 (high) and column select signal 516 (low) are also asserted. And, selected memory cell 514 is turned on, thus output of sense amp is transferred to output 502 of the latch 500 through the local bit line (LBL), the segment bit line (SBL) and the global bit line (GBL) of the multi-stage sense amps and the selector circuit 503, an inverter 519 and buffer, where the drawing illustrates only one stage sense amp for ease of understanding. When the memory block 508 is selected, the selector circuit 503 selects the output 506 with the selector input 504 and 505, where more detailed operation of the selector circuit 503 will be explained as below in FIG. 8D. Thus, the output 506 from the memory block 508 is bypassed to the selector circuit 503 and reached to the output latch circuit 500. In doing so, the output 506 changes the latch output 502, which signal locks the latch (700) itself. And then the output 502 changes the locking signal 526 through an inverter 523, AND gate 524 and a tunable delay circuit 525, so that other latches 520, 541 and 542 are locked by the locking signals 526 and 528 (inverted signal by inverter 527). While first threshold memory cell 514 generates a reference signal, memory cell 534 storing the second threshold data (Vt1) in the memory block 530 is turned off. Hence, inverter 535 keeps pre-charged state and the output 522 keeps high.

One aspect of using two reference cells for generating a reference signal is that the reference signal can be used for characterizing the relation between the first threshold data (in the cell 514) and the second threshold data (in the cell 534). Thereby the AND gate 524 always compares the output data from low threshold data and high threshold data. As a result, the locking signal 526 is generated only if two reference cells generate each signal correctly. Otherwise, the locking signal is not generated. For example, the second threshold (Vt1) memory cell 534 stores negative charges in the charge trap region, which memory cell usually turned off when reading the first threshold data (Vt0). However, the memory cell 534 (storing the second threshold data) may be turned on if the stored charges in the charge trap region are reduced after frequent access. And the memory cell 514 (storing the first threshold data) is usually turned on when reading, but the memory cell may be turned off if some charges are trapped in the charge trap region after frequent access. In either case, the locking signal 526 is not generated. By measuring the locking signal or reference signal, the system can check whether the memory block works correctly or not.

For measuring the second level, the memory block 509 and 531 are selected during next cycle, such that the second voltage level (CG1) is asserted to the memory block 509, and the third voltage level (CG2) is asserted to the memory block 531 where the memory block 509 stores the second threshold data (Vt1) and the memory block 531 stores the third threshold data (Vt2). Thus, the locking signal 526 is generated as long as the memory cells work correctly. And the selector circuits 503 and 529 select the signals from the memory block 509 and 531, respectively. In the similar manner, the third level is measured by the memory block 510 (storing the third threshold data) and the memory block 532 (storing the fourth threshold data). And the fourth level is measured by the memory block 511 (storing the fourth threshold data) and the memory block 533 (storing the fifth threshold data), consecutively. Thus, the main memory blocks 543 and 544 are measured by using the locking signals for each level, respectively. And the output data is transferred to the output latch circuits 541 and 542 through inverter 545. The latched output is shifted to shifter register 540, where the shifter register 540 is composed of conventional flip-flop circuits. And the local amplify transistor of the local sense amp is powered by VDA voltage which is generated by a pull-up transistor 551.

Figure 6A:
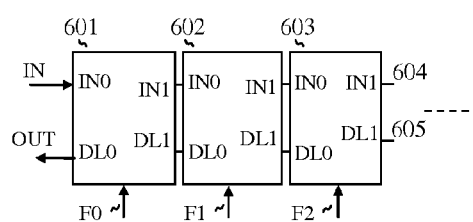
FIG. 6A illustrates a tunable delay circuit.

In FIG. 6A, more detailed tunable delay circuit (as shown 281 in FIG. 2A) is illustrated, wherein multiple delay units 601, 602 and 603 are connected serially, the first delay unit 601 receives input IN and generates output OUT, the second delay unit 602 is connected to the first delay unit, and the third delay unit 603 is connected to the second delay unit 602 and generates outputs 604 and 605, and so on. Each delay unit receives a fuse signal, such that the first delay unit receives F0, the second delay unit receives F1, and the third delay unit receives F2. And more detailed delay unit is illustrated in FIG. 6B, wherein the delay unit 610 receives an input IN0 and a fuse signal Fi, thus the fuse signal Fi selects output from the input IN0 or input DL1, so that a transfer gate 611 is turned on when the fuse signal Fi is low and output of inverter 613 is high, otherwise another transfer gate 612 is turned on when the fuse signal Fi is high and output of inverter 613 is low to bypass DL1 signal. Inverter chain 614 and 615 delays IN0 signal for the next delay unit, where more inverter chains or capacitors can be added for the delay even though the drawing illustrates only two inverters.

Figure 6C:
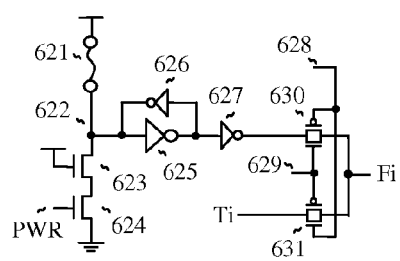
FIG. 6C illustrates a related fuse circuit of the tunable delay circuit.
Figure 6B:
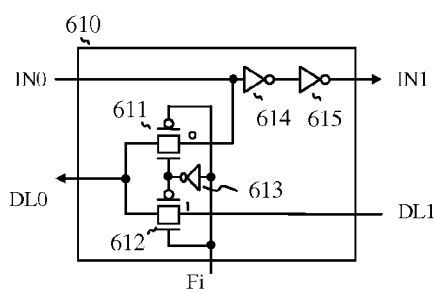
FIG. 6B illustrates a delay unit of the tunable delay circuit.

In FIG. 6C, a related fuse circuit of the tunable delay circuit as shown in FIG. 6A is illustrated, wherein a fuse 621 is connected to a latch node 622, a cross coupled latch including two inverters 625 and 626 are connected to the latch node 622, pull-down transistors 623 and 624 are serially connected to the latch node 622 for power-up reset. Transfer gate 630 is selected by a select signal 629 (high) and another select signal 628 (low) in order to bypass the latch node voltage 622 through inverter 625 and 627. In doing so, fuse data is transferred to output node Fi, otherwise, test input Ti is transferred to Fi when a transmission gate 631 is turned on.

Figure 6D:
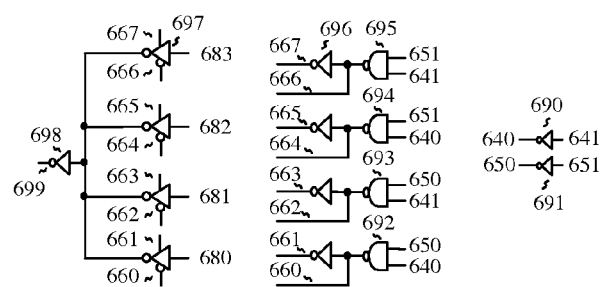
FIG. 6D illustrates a related selector circuit (as shown 503 in FIG. 5), according to the teachings of the present invention.

In FIG. 6D, detailed selector circuit as shown 603 and 629 in FIG. 6 is illustrated. In order to select a signal from four data inputs 680, 681, 682, and 683, one of four tri-state inverters are selected, respectively, such that input 680 is transferred to output node 699 through inverter 698 when selector signal 660 is low and another selector signal 661 is high to turn on the related tri-state inverter. In the similar manner, input 681 is transferred to output node 699 through inverter 698 when selector signal 662 is low and another selector signal 663 is high to turn on the related tri-state inverter. Input 682 is transferred to output node 699 through inverter 698 when selector signal 664 is low and another selector signal 665 is high to turn on the related tri-state inverter. And input 683 is transferred to output node 699 through inverter 698 when selector signal 666 is low and another selector signal 667 is high to turn on the related tri-state inverter 697. When a tri-state inverter is selected, the other tri-state inverters are not selected, such that one of four-input-NAND gates 692, 693, 694 and 695 is asserted to low by selector inputs 641 and 651. Selector inputs 641 and 651 are inverted to generate negated outputs 640 and 650 by inverter 690 and 691 respectively, in order to decode the NAND gates 692, 693, 694 and 695, respectively. And inverter 696 and others generate inverting signals 661, 663, 665 and 667 to select the related tri-state inverters to bypass the related data inputs.

Figure 7A:
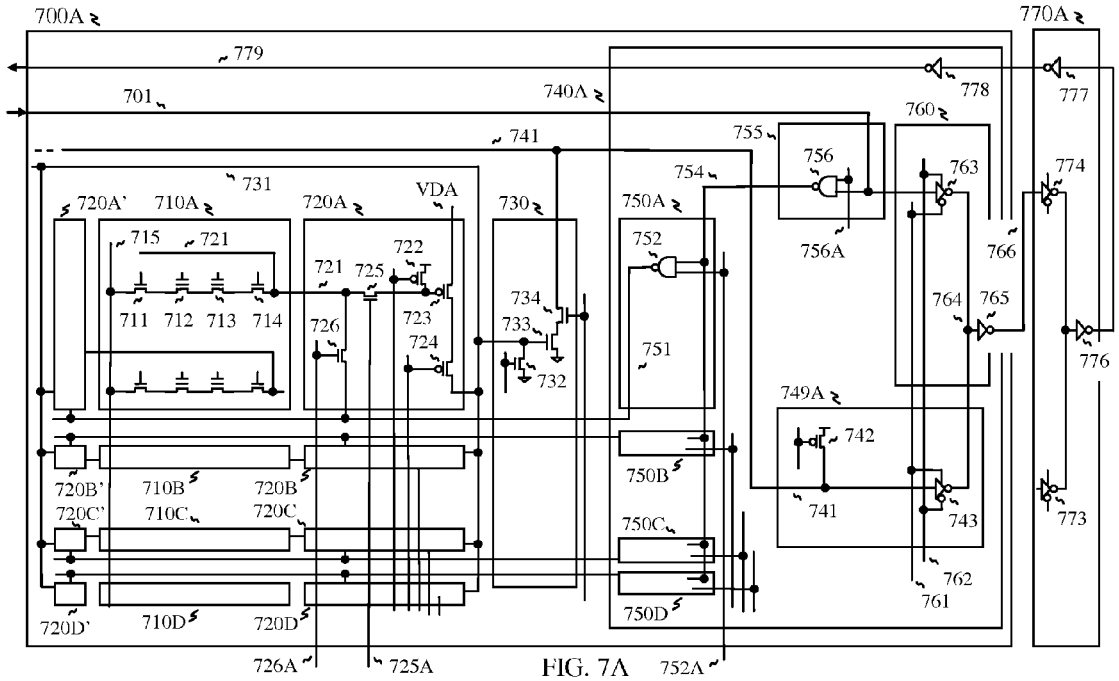
FIG. 7A illustrates detailed decoding scheme for the NAND flash memory.

In FIG. 7A, detailed decoding scheme for the invented NAND flash memory (as shown in FIG. 2A) is illustrated for realizing one of eight column decoding. A memory block 700A includes the NAND strings 710A, 710B, 710C and 710D, the local sense amps 720A, 720B, 720C, 720D, 720A', 720B', 720C' and 720D', a segment sense amp 730, and a global sense amp 740A. The NAND string 710A is composed of memory cells 712 and 713 which are connected to select transistors 711 and 714 serially. The local sense amp 720A is connected to the NAND string 710A through the local bit line 721, wherein the local sense amp 720A includes the program transistor 726, the read transistor 725 connecting to the precharge transistor 722 and the local amplify transistor 723 which is connected to VDA voltage for sensing, where the local amplify transistor 723 is serially connected to the local select transistor 724 for selecting. The program transistor 726 is controlled by the program control signal 726A, and the read transistor 725 is controlled by the read control signal 725A. And the segment sense amp 730 receives an output from at least one local sense amp through the segment bit line 731, where the segment sense amp 730 comprises the reset transistor 732 and the segment amplify transistor 733 connecting to the segment select transistor 734 serially. The global sense amp 740 is composed of the write circuit including the data receiving gate 755 and the write bit line drive circuit 750A, 750B, 750C and 750D, the global amplify circuit 749 including the pre-set transistor 742 and the first tri-state inverter 743, and the data transfer circuit 759 including the second tri-state inverter 763 for bypassing an input from the forwarding write line 701 and the read inverter 765 for transferring a read output from the global amplify circuit 749A and an output from the second tri-state inverter 763 through the common node 764, and the returning buffer circuit 778 for buffering the read output from the forwarding read line 766 through unselected memory block 770A, wherein the unselected memory block includes inverting buffers 774, 776 and 777 while unselected first tri-state inverter 773 is turned off.

When programming (writing), the receiving gate 756 passes the write data 701 while the receive control signal 756A is asserted to high, so that the (selected) write bit line 751 is asserted to low through the internal node 754 while the write enable signal 752A is asserted to high for selected column. In doing so, the write data is transferred to the local bit line 721 through the program transistor 726 and the string select transistor 714 while the program transistor 726 and the string select transistor 714 are turn on and the source select transistor 711 is turn off during programming. But other unselected write circuits 750B, 750C and 750D keep high for inhibiting program because the unselected write enable signals keep low. Hence, memory cells in the unselected columns are inhibited to program (keep erased state) by keeping the unselected local bit line near high, which reduced voltage drop between the control gate and channel region of the floating gate transistor.

When reading data "0", the local bit line 721 is discharged through the selected memory cell 712 and the NAND string by asserting the word line while the passed cell transistor 713, the upper and lower select transistors 711 and 714 are turned on. Discharging the local bit line 721, the local amplify transistor 723 sets up a strong current path to the segment bit line 731 when the local select transistor 724 is turned on. Hence, the segment bit line 731 is quickly charged near VDD voltage from VSS voltage because the segment bit line 731 is floating with capacitive loading of routing wire while the reset transistor 732 is turned off. And, the segment amplify transistor 733 of the segment sense amp 730 quickly discharges the global bit line 741 when the segment select transistor 734 is turned on. And then, the common node 764 is quickly changed to high by the first tri-state inverter 743 receiving the global bit line 741 while the pre-set transistor 742 is turned off. Thus, the read inverter 765 receives the common node voltage 764, while the second tri-state inverter 763 is turned off. In doing so, the read output is transferred to the output latch circuit (shown 270 in FIG. 2A) through the forwarding read line 766, inverting buffers 774, 776, 777 and 778 in unselected memory block 770A, and the returning read line 779 while unselected first tri-state inverter 773 keeps turn-off state.

In contrast, when reading data "1" (high threshold data), the local bit line 721 is not discharged because the selected memory cell 712 is not turned on, thus the local bit line 721 is not changed at a short time or very slowly discharged by turn-off current of the memory cell. Thereby the local amplify transistor 723 does not set up a strong current path but sets up very weak current path with leakage current to the segment bit line 731. Hence, the segment bit line is very slowly charged. And the global bit line 741 is also slowly discharged by the segment sense amp. As a result, the common node 764 of the global sense amp is not raised to high during a predetermined time, such that the common node 764 keeps the pre-charged state at VSS voltage. In doing so, data "1" is not arrived to the output latch circuit, such that the current difference of the selected memory cell is converted to time difference with gain difference of the sense amps. Thus data "0" serves as a reference signal to reject latching data "1" to the output latch circuit for differentiating the fast data (low threshold data) and the slow data (high threshold data) in a time domain. Alternatively, drain node of the local amplify transistor 723 of the local sense amp 720A is connected (not shown) to other drain nodes of other local sense amps 720B, 720C and 720D for bypassing one of four decoder where the memory column 700A serves as a reference memory block, so that the reference signal is generated as long as one of four memory cells works.

During read operation, an aspect is that the selected local bit line is shielded by adjacent local bit lines, because unselected adjacent local bit lines keep low through the program transistor. This helps to read data "0" more accurately, because the local bit line is sustained at VDD voltage, which turns off the local amplify transistor.

In terms of column decoding scheme, one column is selected from eight columns, such that only one write bit line 751 is asserted to low when programming, while other write bit lines keep high because NAND gate 752 of the write bit line driver circuit 750A de-activated by write column select signals. When reading data, one of eight columns are selected by the local select transistor 724, such that left four local sense amps 720A', 720B', 720C' and 720D' are de-activated by unselected local select signals, but one of four local sense amps 720A, 720B, 720C, and 720D in the right hand side is activated by turning on the local select transistor 724. Then, the segment sense amp 730 and the global sense amp 740 transfers the read output to the output node. And there are various modifications and alternatives for configuring the sense amps, in order to read data from the memory cell through the multi-divided bit line.

Figure 7B:
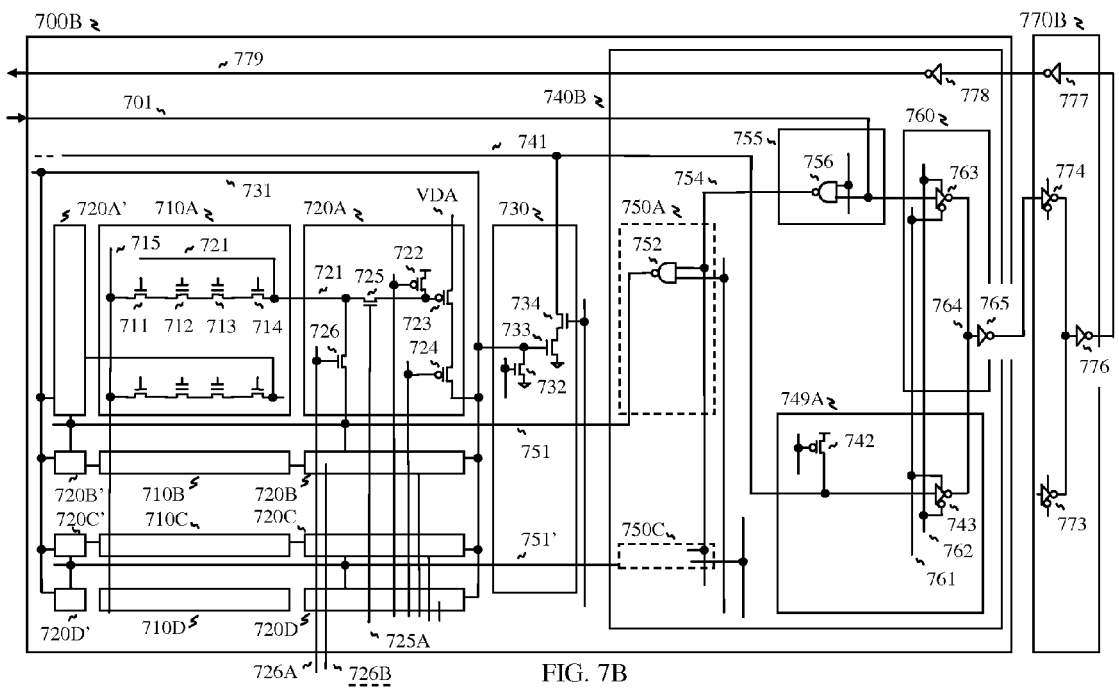
FIG. 7B illustrates alternative decoding scheme.

In FIG. 7B, alternative decoding scheme for reducing wires is illustrated, wherein the write bit lines are reduced from four lines to two lines, such that the write circuit 750A drives the write bit line 751 and the write circuit 750C drives the write bit line 751', while two write bit lines are removed. Hence, total wires on the eight columns reduced from eight lines to six lines, which is useful to increase metal pitch for wring. And other circuits are the same as those of FIG. 7A, such that the memory block 700B includes the NAND strings 710A, 710B, 710C and 710D, the local sense amps 720A, 720B, 720C, 720D, 720A', 720B', 720C' and 720D', the segment sense amp 730, and the global sense amp 740B connecting to next memory block 770B, where only the write circuits 750A and 750C are used. However, additional select signal for decoding the program transistor 726B is added for selecting one of two program transistors.

Figure 7C:
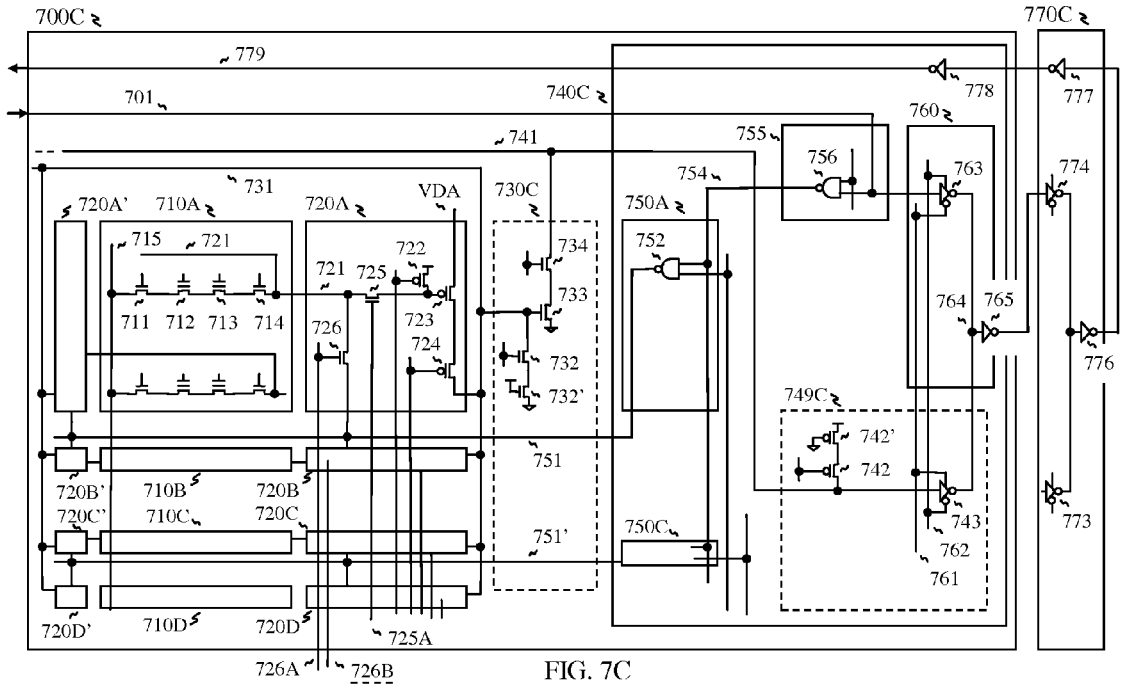
FIG. 7C illustrates alternative configuration including common source amplifiers.

In FIG. 7C, alternative configuration including common source amplifiers for reading the memory cells is illustrated, wherein the memory block 700C includes the NAND strings 710A, 710B, 710C and 710D, the local sense amps 720A, 720B, 720C, 720D, 720A', 720B', 720C' and 720D', and the global sense amp 740C connecting to next memory block 770C. The local sense amp 720A includes the local amplify transistor 723 and the local select transistor 724 which is connected to active load transistors 732 and 732' for configuring a first common source amplifier, and the segment sense amp 730C includes the segment amplify transistor 733 and the segment select transistor 734 which is connected to active load transistors 742 and 742' for configuring a second common source amplifier, wherein the active load transistors 742 and 742' are located in the global sense 740C. And the first tri-state inverter 743 receives the read output where other configurations are the same as FIG. 7A. The common source amplifiers serve as an amplify circuit, which amplify the local bit line voltage with transfer curve of the inverting amplifiers, wherein the active load transistors have more resistance than those of the amplify transistors, such as 10 times for obtaining high gain.

Figure 7D:
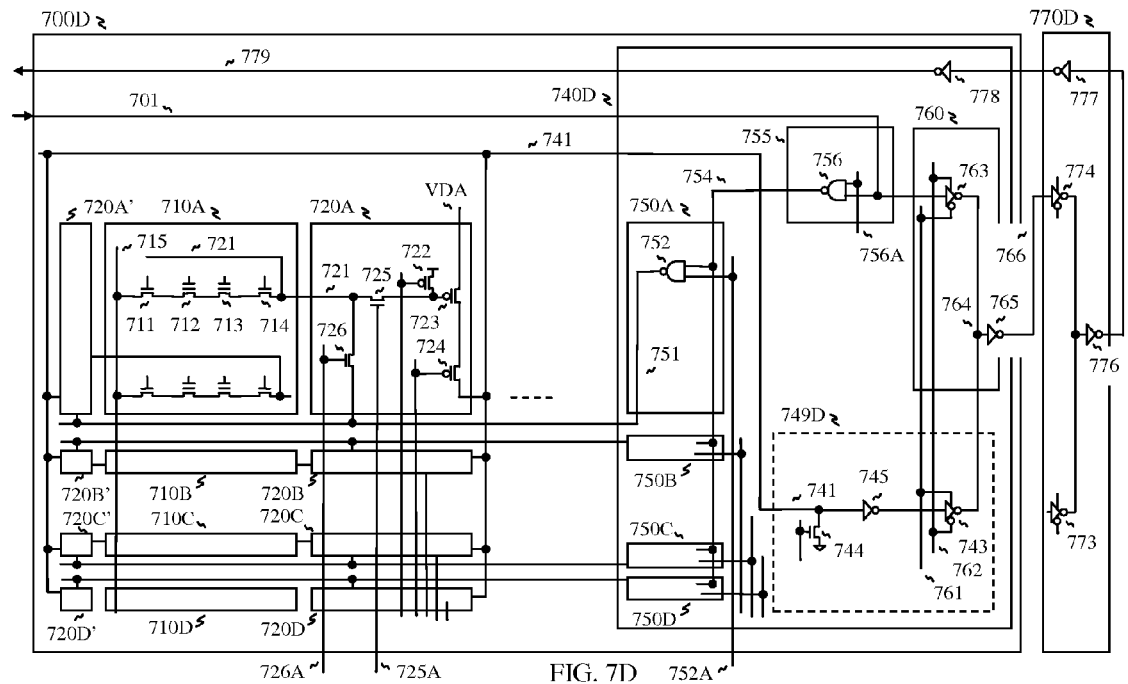
FIG. 7D illustrates alternative configuration including two stage sense amps, according to the teachings of the present invention.

In FIG. 7D, alternative configuration including two stage sense amps is illustrated, which eliminates the segment read line. In the configuration, there is no segment sense amp for realizing two stage sensing scheme, such that the memory block 700D includes the NAND strings 710A, 710B, 710C and 710D, the local sense amps 720A, 720B, 720C, 720D, 720A', 720B', 720C' and 720D', and the global sense amp 740C connecting to next memory block 770D with no segment sense amp. By eliminating the segment sense amp and the segment read line, seven wires are used for wiring on eight columns. And for recovering inverted phase with two stage sense amps, the global sense amp 740D is slightly modified, such that a global reset transistor 744 is connected to the global bit line 741, and an inverter 745 is added before the first tri-state inverter 743 in the global amplify circuit 749D, while other circuits are the same as FIG. 7A.

Figure 8A:
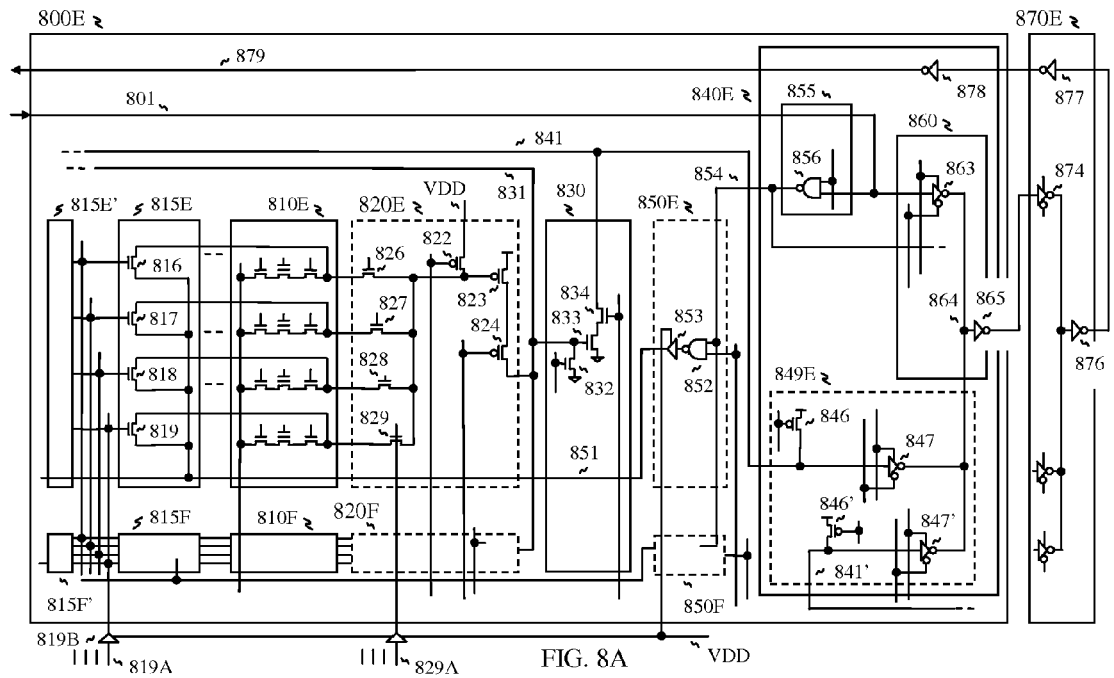
FIG. 8A illustrates alternative configuration for the local sense amp.

In FIG. 8A, alternative configuration for the local sense amp is illustrated. In order to share the amplifying portion of the local sense amp, four read transistors are connected to the local amplify transistor, such that the local sense amps 820E and 850F are connected NAND strings 810E and 810F through read transistors 826, 827, 828 and 829, respectively. And write portions 815E and 815F of the local sense amp are placed on the other side of amplify portion of the local sense amp, so that the write (program) control signal from a level shifter 819B is shared by adjacent memory segments 815E' and 815F'. The program transistors 816, 817, 818 and 819 are connected to the write bit line 851. For programming, the program transistor 819, for example, is turned on by a program control signal which is generated by an enable signal 819A with a level shifter 819B. And the write bit line 851 is powered by VDD voltage with a level shifter 853. And the read transistor 816, 817, 818 and 819 are also powered by VDD voltage for pre-charging the local bit line through the pre-charge transistor 822 which is powered by VDD voltage for full level pre-charging, when reading data. But other circuits are powered by internal voltage, such as VDL, which is at least lowered than VDD−VT voltage. With VDL voltage operation, power consumption for the operation is reduced. Alternatively, the gate input of the program transistor 819 and the read transistor 829 are forced to VDDH voltage which is higher than VDD+VT voltage. And in this configuration, the global amplify circuit 849E is composed of a tri-state inverter 847 which is pre-set by the pre-set transistor 846. Alternatively, another tri-state inverter 847' is connected to the common node 864 from right hand side. And the tri-state inverter 847' is pre-set by the pre-set transistor 846', for sharing the global sense amp. During standby, the global bit lines 841 and 841' from left hand side and right hand side are pre-set to high, and then one of global bit line is discharged when reading data "0". Otherwise, the global bit lines 841 keeps pre-set state when reading data "1". And other circuits are the same as above in FIG. 7B, wherein the memory block 800E selects one of eight columns and adjacent memory block 870E also selects one of eight columns.

Figure 8B:
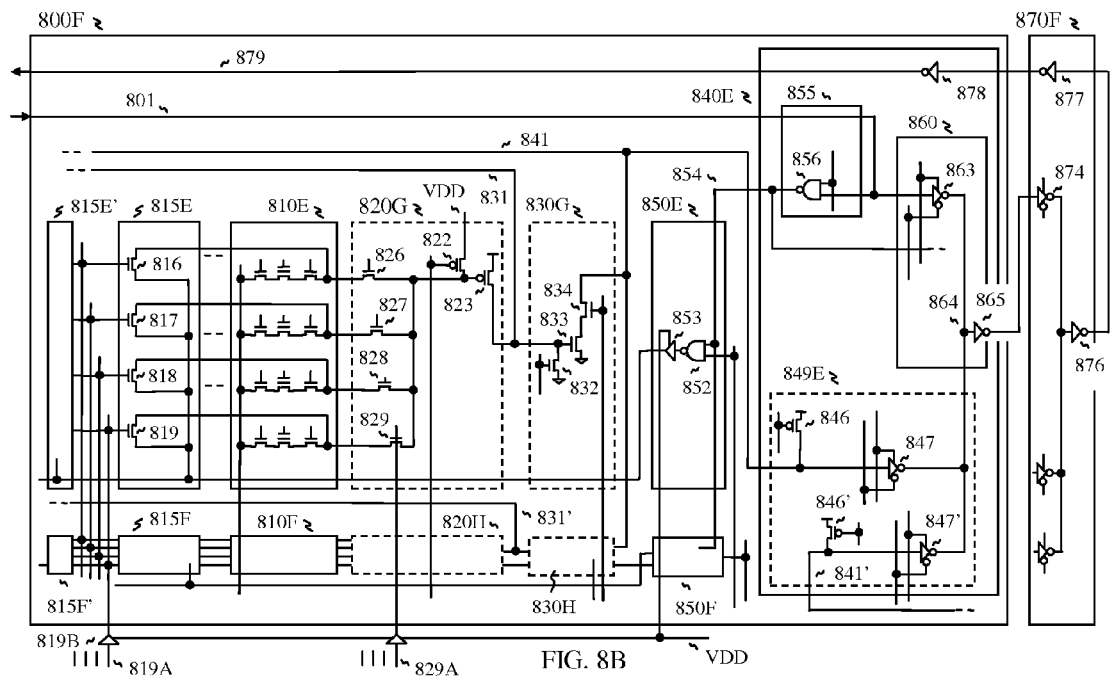
FIG. 8B illustrates alternative configuration for the local sense amp for reducing area, according to the teachings of the present invention.

In FIG. 8B, alternative configuration for reducing area of the local sense amp is illustrated, wherein the memory block 800F includes modified local sense amps 820G and 820H, and two segment sense amps 830G and 830H for receiving the read output, respectively. And other circuit configuration is the same as FIG. 8E, except internal configuration of the local sense amp 820G and 820H, wherein the local sense amp 820G and 820H have no local select transistor. Hence, the local amplify transistor 823 is directly connected to the segment sense amp through the segment bit line 831, where one of two segment sense amps are selected for reading data. With this configuration, two local select signals are removed to select one of two local sense amps, which reduced area more effectively with same performance.

Figure 9A:
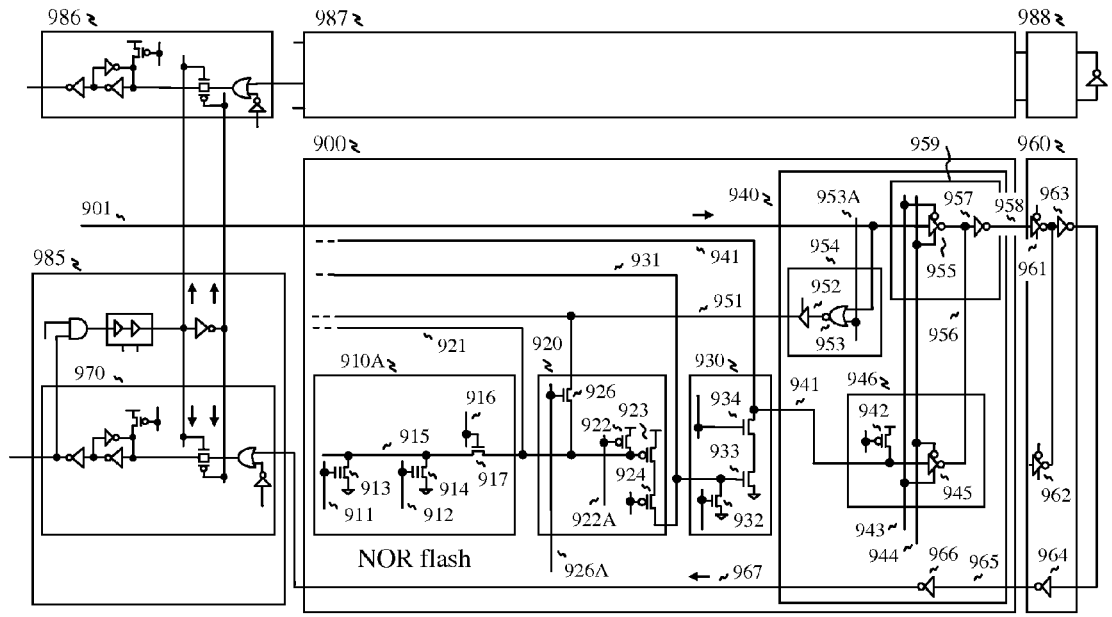
FIG. 9A illustrates alternative configuration for reading a NOR flash memory.

In FIG. 9A, alternative configuration for reading a NOR flash memory is illustrated, wherein most of circuits are same as NAND flash memory shown in FIG. 2A, except a NOR string 910A. More specifically, a memory block 900 comprises the NOR string 910A, a local sense amp 920, a segment sense amp 930, and a global sense amp 940. And other memory blocks 960, 987 and 988 are composed of same configuration as the memory block 900. The local sense amp 920 is connected to the NOR string 910A through a local bit line 921, wherein the NOR string 910A includes a memory cell array configuring a NOR flash memory, such that the memory cell array is connected to the local bit line 921 through a string select transistor 917 which is selected by a string select signal 916, where the memory cell 913 is controlled by a word line 911 and the other memory cell 914 is controlled by the other word line 912. A program transistor 926 is connected to the local bit line 921 for programming, and the program transistor 926 is controlled by a program control signal 926A, where the program transistor 926 serves as a write switch between the local bit line 921 and a write bit line 951. The local bit line 921 is connected to a gate of a local amplify transistor 923, a pre-charge transistor 922 is connected to the local bit line 921 for pre-charging, and a local select transistor 924 is serially connected to the local amplify transistor 923 for enabling and selecting the local amplify transistor.

The segment sense amp 930 includes a reset transistor 932 for resetting a segment bit line 931 which is connected to the local select transistor 924, a segment amplify transistor 933 for receiving an output from one of multiple local sense amps through the segment bit line 931, and a segment select transistor 934 connecting to the segment amplify transistor for selecting the segment amplify transistor. The global sense amp 940 includes a write circuit 954 including a level shifter 952 for driving the write bit line 951 and a NOR gate 953 for receiving write data from a forwarding write line 901 and for driving the write bit line 951. And a global amplify circuit 946 including a first tri-state inverter 945 for reading the global bit line 941 and a pre-set transistor 942 for pre-setting the global bit line 941 to high, and a data transfer circuit 959 including a second tri-state inverter 955 for bypassing an input from a forwarding write line 901 and a read inverter 957 for transferring a read output from the global amplify circuit 946 or an output from the second tri-state inverter 955 through a common node 956, and a returning buffer circuit 966 for buffering a returning read line 965. A buffered data 967 is transferred to the output latch circuit 970, wherein the output latch circuits 970 and 986 are composed of same configuration shown 270 in FIG. 2A. The latch control circuit 985 is also composed of same configuration shown in 285 in FIG. 2A.

During standby, the local bit line 921 is reset to ground voltage by turning on the string select transistor 917 and the program transistor 926, while the write bit line 951 keeps ground voltage by the a level shifter 952 and the NOR gate 953 with a write enable signal 953A at high, in order to reduce disturbance for the memory cell.

When reading data "0" (low threshold data), the program transistor 926 is turned off for releasing the local bit line 921 from the reset state (ground voltage). And then, the pre-charge transistor 922 is turned on to pre-charge the local bit line 921 to the supply voltage while the string select transistor 917 keeps turn-on state. After pre-charging, the pre-charge transistor 922 is turned off. Then, the word line 911 is asserted to a pre-determined voltage for measuring the memory cell 913 while unselected word line 912 keeps low state. Thus, the local bit line 921 is discharged through the selected memory cell 913. Discharging the local bit line 921, the local amplify transistor 923 sets up a strong current path to the segment bit line 931 when the local select transistor 924 is turned on. Hence, the segment bit line 931 is quickly charged to VDD voltage from VSS voltage while the reset transistor 932 is turned off. And, the segment amplify transistor 933 of the segment sense amp 930 quickly discharges the global bit line 941 when the segment select transistor 934 is turned on. And then, the common node 956 is quickly changed to high by the first tri-state inverter 945 receiving the global bit line 941 while the pre-set transistor 942 is turned off. Thus, the read inverter 957 receives the common node voltage 956, while the second tri-state inverter 955 is turned off. In doing so, the read output is transferred to the output latch circuit (shown 270 in FIG. 2A) through the forwarding read line 956, inverting buffers 961, 963, 964 and 966 in unselected memory block 960, and the returning read line 965 while unselected first tri-state inverter 962 keeps turn-off state.

In contrast, when reading data "1" (high threshold data), the local bit line 921 is not discharged because the selected memory cell is not turned on, thus the local bit line 921 is not changed at a short time or very slowly discharged by turn-off current of the memory cell. Thereby the local amplify transistor 923 does not set up a strong current path but sets up very weak current path with leakage current to the segment bit line 931. Hence, the segment bit line is very slowly charged. And the global bit line 941 is also slowly discharged by the segment sense amp. As a result, the common node 956 of the global sense amp is not raised to high during a predetermined time, such that the common node 956 keeps the pre-charged state at VSS voltage. In doing so, data "1" is not arrived to the output latch circuit, such that the current difference of the selected memory cell is converted to time difference with gain difference of the sense amps. Thus data "0" serves as a reference signal to reject latching data "1" to the output latch circuit for differentiating the fast data (low threshold data) and the slow data (high threshold data) in a time domain.

For erasing, the local bit line is sustained to VSS voltage by turning on the program transistor 926 and the string select transistor 917 while the write bit line keeps VSS voltage, and the selected word line is asserted to a pre-determined erase voltage, for example −10V. After then for programming, the local bit line voltage is raised by the level shifter 952 to a pre-determined program voltage, for example 6V, while the selected word line is also asserted to a program word line voltage, for example 10V. And the program transistor 926 and the string select transistor 917 transfers output of the level shifter 952, so that the gate voltage of the transfer transistors 926 and 917 are raised higher than the local bit line voltage. And during erase and program, the pre-charge transistor 922 and the local select transistor 924 keep turn-off state, and other read path is also turned off.

Figure 9B:
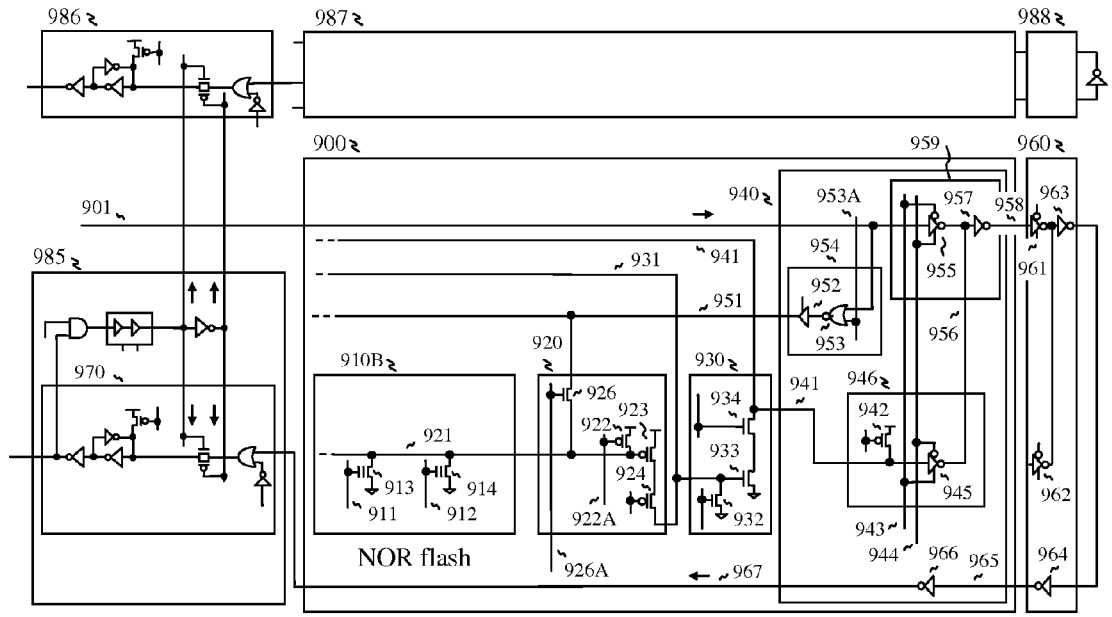
FIG. 9B illustrates another alternative configuration for reading a NOR flash memory, according to the teachings of the present invention.

In FIG. 9B, another alternative configuration for reading a NOR flash memory is illustrated, wherein the memory cell array is connected to the local bit line 921 directly. Thus, there is no string select transistor, which realizes fast read operation with direct connection to the local sense amp. Other circuits are the same as FIG. 9A, and operations are also same. Hence, detailed operations are not skipped.

Methods of Fabrication

The memory cells can be formed from single crystal silicon as the conventional flash memory cell. Alternatively, the memory cells can be formed from thin-film polysilicon layer within the current CMOS process environment. Furthermore, the memory cells can be formed in between the routing layers. In this manner, fabricating the memory cells is independent of fabricating the peripheral circuits on the surface of the wafer. In order to form the memory cells in between the metal routing layers, LTPS (Low Temperature Polycrystalline Silicon) can be used, as published, U.S. Pat. No. 5,395,804, U.S. Pat. No. 6,852,577 and U.S. Pat. No. 6,951,793. The LTPS has been developed for the low temperature process (around 500 centigrade) on the glass in order to apply the display panel. Now the LTPS can be also used as a thin film polysilicon transistor for the memory device. The thin film based transistor can drive multi-divided bit line which is lightly loaded, even though thin film polysilicon transistor can flow less current than single crystal silicon based transistor on the surface of the wafer, for example, around 10 times weaker than that of conventional transistor, as published, "Poly-Si Thin-Film Transistors: An Efficient and Low-Cost Option for Digital Operation", IEEE Transactions on Electron Devices, Vol. 54, No. 11, November 2007, and "A Novel Blocking Technology for Improving the Short-Channel Effects in Polycrystalline Silicon TFT Devices", IEEE Transactions on Electron Devices, Vol. 54, No. 12, December 2007. During LTPS process, the MOS transistor in the control circuit and routing metal are not degraded. And the steps in the process flow should be compatible with the current CMOS manufacturing environment as published, such as U.S. Pat. Nos.

7,283,393, and 7,183,174, and 7,157,332, and 7,141,474 to form the NAND flash memory cell. And forming the thin film transistor is similar to forming TFT (thin film transistor) SRAM, as published, U.S. Pat. No. 6,670,642. In this respect, detailed manufacturing processes for forming the memory cell, such as width, length, thickness, temperature, forming method, or any other material related data, are not described in the present invention.

In FIG. 10A to 10C, example layout for the local sense amp is illustrated, wherein the local sense amp 1020 (220 in FIG. 2A) is placed next to memory cells (not shown). The local sense amp 1020 includes NMOS transistor 1026 as a program transistor, transistor 1025 as a read transistor, PMOS transistor 1022 as a pre-charge transistor, transistor 1023 as an amplify transistor which is powered by VDA voltage for sensing, and transistor 1024 as a local select transistor, wherein p+ region of the PMOS transistors are formed on deep n-well (DNW), and n+ region of the NMOS transistors are formed on a separate p-well 1029 which is enclosed by the deep n-well (DNW). And metal-1 region and via-1 region are defined as shown in FIG. 10B, such that metal-1 region 1021 is connected to the program transistor 1026 and the read transistor 1025, where metal-1 region 1021 serves as the local bit line and metal-1 region 1051 serves as the write bit line. In FIG. 10C, metal-2 region is defined, such that metal-2 region 1031 is used to connect the segment bit line, and column select signals are defined for selecting the local sense amp, for example, column select signal 1024A is connected to the local select transistor 1024 while another metal-2 lines are passing. And the segment bit line 1031 is connected to output node of the local select transistor 1024 (in FIG. 10A) through via-1 and metal-1 region. The segment bit line 1031 is shared by adjacent local sense amps (not shown), because the local select transistor 1024 is selected from one of four local sense amps. In FIG. 10D, a schematic for the local sense amp 1020 is illustrated for ease of understanding the layout. The memory cell 1010 is connected to the local sense amp 1020 through the local bit line 1021. And the body 1019 of the memory cell is connected a p-well which is separated from substrate (not shown). The local sense amp 1020 includes the program transistor 1026, the read transistor 1025, the pre-charge transistor 1022, the local amplify transistor 1023 and the local select transistor 1024 which is connected to the segment bit line 1031. The NMOS program transistor 1026 and the NMOS read transistor 1025 are formed on a separate p-well 1029. And the column select signal 1024A is connected to the local select transistor 1024 for enabling the local sense amp while the other column select signals are passing.

Referring now to FIG. 11A, a related circuit schematic to explain a cross sectional view for the memory cell array (NAND string) and the local sense amp 1120, wherein the memory cells 1103 and 1104 are serially connected, the select transistor 1102 is connected to the source line 1101, and the other select transistor 1106 is connected to the local bit line 1121. The local sense amp 1120 comprises the read transistor 1125 connecting to the local sense amp 1121, the local pre-charge transistor 1122, the local amplify transistor 1123 (which is powered by VDA voltage) and the local select transistor 1124 which is connected to the segment bit line 1131, where the program transistor is not shown.

Referring now to FIG. 11B in view of FIG. 11A, a cross sectional view for the memory cell array (NAND string) 1100 and the local sense amp 1120 is illustrated as an example implementation, wherein the memory cells are formed on the p-well 1119, the NMOS transistor 1125 of the local sense amp 1120 is formed on the separate p-well 1129, and the PMOS transistors 1122 is formed on the deep n-well (DNW) region 1109 which is formed on the p-substrate 1199. In the NAND string 1100, memory cell 1104 is placed in the middle region of the select transistors. The local sense amp is connected to the NAND string through the local bit line 1121. The transistors are isolated by STI (Shallow Trench Isolation) region 1198.

Figure 12:
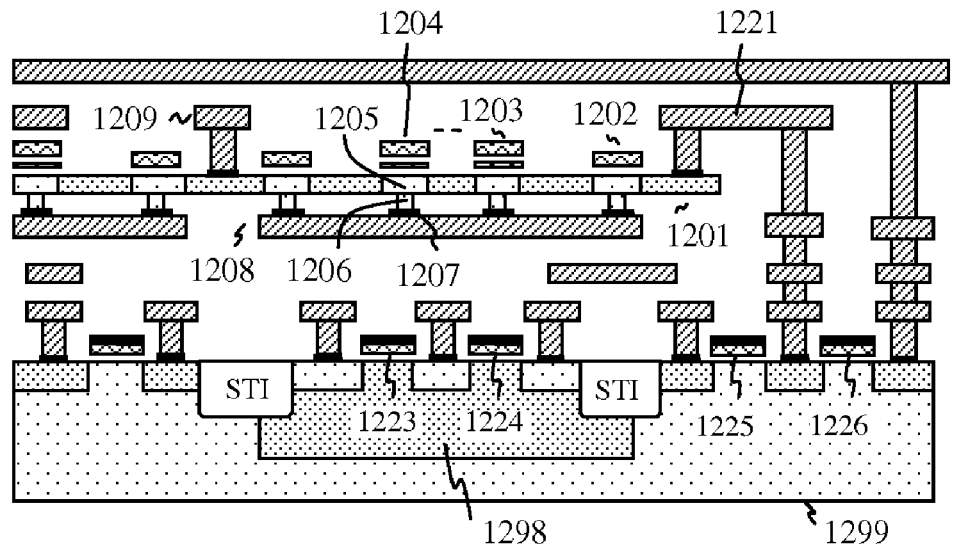
FIG. 12 illustrates a cross sectional view for a stacked memory cell on peripheral circuit, according to the teachings of the present invention.

In FIG. 12, an example cross sectional view including the memory cell which is stacked over a peripheral circuit, wherein the memory cell is formed from polysilicon layer, such as LTPS (Low Temperature Polycrystalline Silicon) layer, so that the memory cells 1203 and 1204 are formed over metal bias line 1208 which provides a body bias voltage, and the source line 1209 is connected the NAND string. Alternatively, the memory cell can be formed from various semiconductor materials, such as silicon-germanium and germanium. The charge trap region is formed in between the poly gate 1204 and body region 1205. The body region 1205 is connected to the metal line 1208 through poly plug 1206 and ohmic contact region 1207. The program transistor 1226 is connected to the local bit line 1221, and the read transistor 1225 is connected to the local bit line 1221 as well. And more memory cells can be serially connected even though the drawing illustrates two memory cells only for simplifying the drawing. In the peripheral circuit region (first floor), the local sense amp is composed of the (PMOS) local amplify transistor 1223 and the local amplify transistor 1224, and which transistors are formed on the n-well region 1298. And other NMOS transistors are formed on the substrate 1299.

Figure 13:
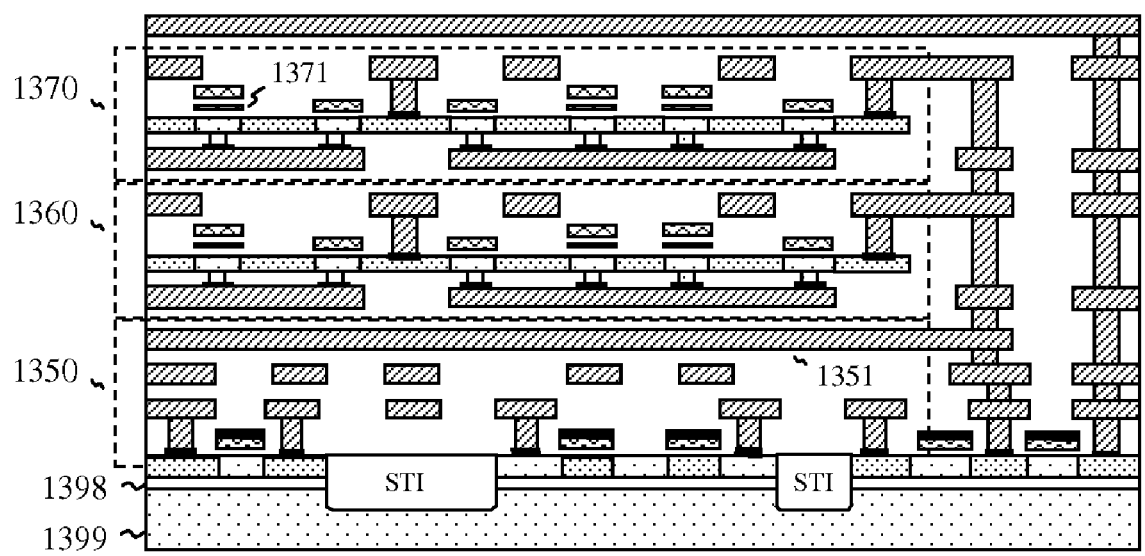
FIG. 13 illustrates a cross sectional view for multi-stacked memory cells on peripheral circuit, according to the teachings of the present invention.

In FIG. 13, a cross sectional view for the multi-stacked memory cell is illustrated, wherein the memory string in the third floor 1370 is formed on the second floor 1360, and the memory string in the second floor 1360 is formed on the control circuit 1350 which is formed on the surface of the wafer. The memory strings are connected to the local bit line 1351 through multiple layers which are also used for routing layers in the peripheral circuits (not shown). In particular, the local bit line 1351 is relatively shorter than that of planar type memory cells shown in FIG. 11B, in order to compensate low current driving capability of the TFT (thin film transistor) based floating gate memory cell 1371, such that the local bit line is 10 to 20 times shorter. In consequence, the access time is similar to planar type memory with shorter local bit line, and more local sense amps are repeated to read the memory cell but area penalty is negligible because the local sense amps are formed under the memory cells. The control circuit 1350 is formed from single crystal silicon layer on the buried oxide layer 1398 of the SOI (Silicon on Insulator) wafer 1399 alternatively.

Figure 14:
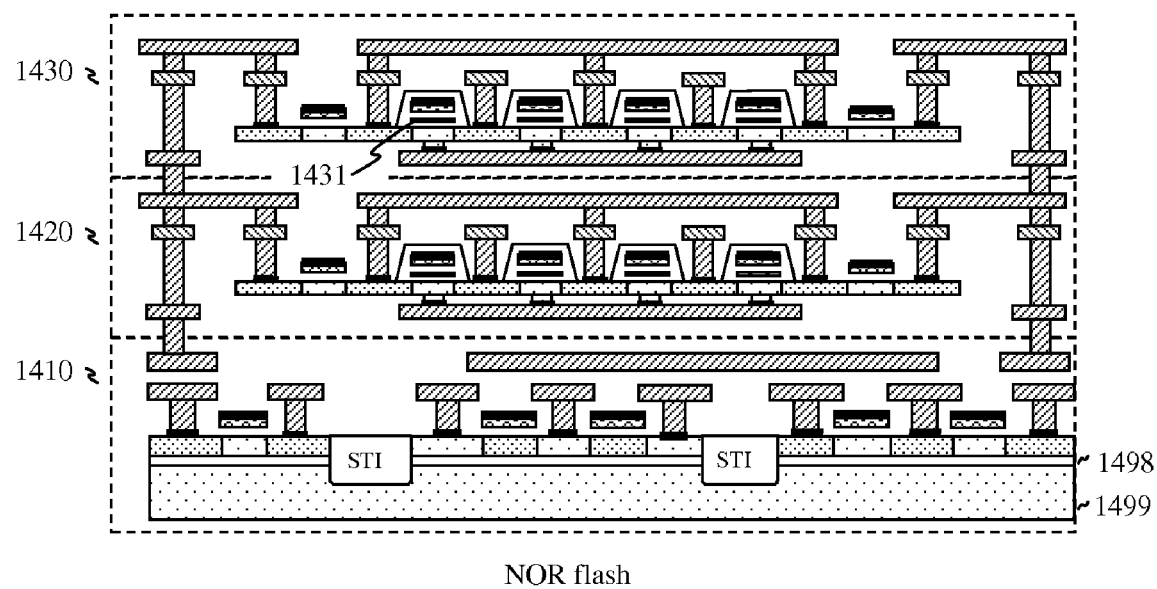
FIG. 14 illustrates a cross sectional view for fabricating a NOR flash memory, according to the teachings of the present invention.

In FIG. 14, a cross sectional view for configuring a NOR flash memory (shown FIG. 9B) is illustrated, wherein the NOR string 1430 is formed on another NOR string 1420 which is formed on the peripheral circuit, where the peripheral circuit is formed on the surface of the wafer. And the peripheral circuit can be formed from single crystal silicon layer on the buried oxide layer 1498 of the SOI (Silicon on Insulator) wafer 1499. And other layers are the same as FIG. 13.

Furthermore, the charge trap region 1431 of the floating gate memory cell and the TFT floating gate memory cell can be formed from various materials, such as polysilicon layer to form a flash memory, nitride layer to form an MNOS (metal-nitride-oxide semiconductor) memory or a SONOS (silicon-oxide-nitride-oxide semiconductor) memory, alumina to form a MAOS (metal-alumina-oxide-semiconductor) or a MAS (metal-alumina-semiconductor), and nanocrystal layer to form a nanocrystal memory as published, U.S. Pat. No. 6,690,059. In particular, quantum dot can be used to form a single electron memory, such that one or two charge trap regions can be used to store charge as published, U.S. Pat. No. 5,960,266 and No. 7,105,874.

While the description here has been given for configuring the memory circuit and structure, alternative embodiments would work equally well with reverse connection, such that p-channel NAND flash memory can be used, as published in U.S. Pat. Nos. 5,581,504 and 7,061,805. Thus, the memory cell configuration is also reversed, wherein the floating gate storage device includes p-type source and drain with n-type body. And also, the control signal polarities are reversed in order to control the reversely configured memory cell.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
   a memory cell which includes a floating gate MOS transistor having a charge trap region; and
   a memory string which includes a memory cell array configuring a NAND series connection, a first select transistor connecting to one side of the memory cell array, and a second select transistor connecting to the other side, where the first select transistor is connected to a local bit line; and
   a first dynamic circuit serving as a local sense amp connecting to the memory string, wherein the first dynamic circuit includes a pre-charge transistor for pre-charging the local bit line through a read transistor, a local amplify transistor for reading an amplify node connecting to the read transistor, where the local amplify transistor is serially connected to a local select transistor, a write transistor for connecting the local bit line to a write bit line; and
   a second dynamic circuit serving as a segment sense amp connecting to the local select transistor through a segment bit line, wherein the second dynamic circuit is composed of a reset transistor for resetting the segment bit line, a segment amplify transistor for reading the segment bit line where the segment amplify transistor is serially connected to a segment select transistor connecting to a global bit line; and
   a first tri-state inverter serving as an amplify circuit of a global sense amp connecting to the global bit line, wherein the global sense amp includes a read circuit, a data transfer circuit, a returning buffer and a write circuit; and the read circuit includes the first tri-state inverter for reading the global bit line and a pre-set transistor for pre-setting the global bit line; and the data transfer circuit includes a second tri-state inverter for bypassing a write data and a read inverter for reading a common node which is connected to the first tri-state inverter and the second tri-state inverter; and the write circuit receives the write data and drives the write bit line; and the returning buffer receives a read output from the read inverter through a returning read path; and
   a buffered data path connecting to the global sense amp, wherein the buffered data path is composed of a forwarding write line connecting to the second tri-state inverter, a forwarding read line connecting to the read inverter, and a returning read line connecting to the returning buffer; and
   an output latch circuit receiving and storing an output from the returning read line; and
   a latch control circuit generating a locking signal which is generated by a reference signal based on at least a reference memory cell, in order to lock the output latch circuit.

2. The memory device of claim 1, wherein the local amplify transistor and the segment amplify transistor are composed of longer channel length transistor than that of the reset transistor of the segment sense amp and the pre-set transistor of the global sense amp.

3. The memory device of claim 1, wherein the local amplify transistor and the segment amplify transistor are composed of high threshold MOS transistor, for realizing low power operation.

4. The memory device of claim 1, wherein the local sense amp includes the four read transistors between the four local bit lines and the amplify node which is connected to the pre-charge transistor and the local amplify transistor for amplifying the amplify node, where the local amplify transistor is serially connected to the local select transistor; and four program transistors serving as write switches between the write bit line and the four local bit lines connecting to the memory string.

5. The memory device of claim 1, wherein the local sense amp includes the four read transistors between the four local bit lines and the amplify node which is connected to the pre-charge transistor and the local amplify transistor for amplifying the amplify node, where the local amplify transistor is connected to the global bit line; and four program transistors serving as write switches between the write bit line and the four local bit lines connecting to the memory string.

6. The memory device of claim 1, wherein the write circuit of the global sense amp is composed of a first NAND gate as a receiving gate and a second NAND gate as an inverting gate for receiving the write data through the forwarding write line and driving the write bit line.

7. The memory device of claim 1, wherein the global sense amp includes the first tri-state inverter for reading an output from one of the local sense amps through the global bit line which is connected to the local select transistor and the pre-set transistor for pre-setting the global bit line, for configuring two stage sense amps.

8. The memory device of claim 1, wherein the latch control circuit includes a tunable delay circuit, such that the tunable delay circuit receives at least a reference signal which is generated by a reference memory cell; and the tunable delay circuit generates a locking signal by delaying at least one reference signal from the multiple reference signals; and tuning information for the tunable delay circuit is stored in a nonvolatile memory.

9. The memory device of claim 1, wherein the latch control circuit includes a tunable delay circuit, such that the tunable delay circuit receives multiple reference signals which are generated by multiple reference memory cells; and the tunable delay circuit generates a locking signal by delaying at least one reference signal from the multiple reference signals; and tuning information for the tunable delay circuit is stored in a nonvolatile memory.

10. The memory device of claim 1, wherein the floating gate MOS transistor of the memory cell stores multi-level data in a charge trap region.

11. The memory device of claim 1, wherein the floating gate MOS transistor of the memory cell is formed from various materials, such as single crystal silicon, polysilicon, silicon-germanium and germanium.

12. The memory device of claim 1, wherein the charge trap region of the memory cell includes nitride layer to form an MNOS (metal-nitride-oxide semiconductor) memory and a SONOS (silicon-oxide-nitride-oxide semiconductor) memory.

13. The memory device of claim 1, wherein the charge trap region of the memory cell includes alumina layer to form a MAOS (metal-alumina-oxide-semiconductor) and a MAS (metal-alumina-semiconductor).

14. The memory device of claim 1, wherein the charge trap region of the memory cell includes nanocrystal layer to form nanocrystal memory, and quantum dot to form a single electron memory.

15. The memory device of claim 1, wherein the floating gate MOS transistor of the memory cell includes n-channel MOS field effect transistor or p-channel MOS field effect transistor.

16. The memory device of claim 1, wherein the floating gate MOS transistor of the memory cell is formed from thin film transistor which is composed of a gate region, a charge trap region, a drain region, a source region and a body region, where the body region is biased a bias voltage.

17. The memory device of claim 1, wherein the floating gate MOS transistor of the memory cell is formed on peripheral circuits.

18. The memory device of claim 1, wherein the floating gate MOS transistor of the memory cell is stacked over another floating gate MOS transistor.

19. The memory device of claim 1, wherein the memory string includes a memory cell array configuring a NOR flash memory such that the memory cell array is connected to the local bit line through a string select transistor.

20. The memory device of claim 1, wherein the memory string includes a memory cell array configuring a NOR flash memory such that the memory cell array is connected to the local bit line directly.

* * * * *